US012648244B2

(12) United States Patent
Noh et al.

(10) Patent No.: US 12,648,244 B2
(45) Date of Patent: Jun. 2, 2026

(54) IMAGE SENSOR INCLUDING COLOR SEPARATION LENS ARRAY AND ELECTRONIC APPARATUS INCLUDING THE IMAGE SENSOR

(71) Applicant: SAMSUNG ELECTRONICS CO., LTD., Suwon-si (KR)

(72) Inventors: Yohwan Noh, Jeongeup-si (KR); Daekwan Kim, Suwon-si (KR); Seungjun Lee, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 970 days.

(21) Appl. No.: 17/840,916

(22) Filed: Jun. 15, 2022

(65) Prior Publication Data

US 2022/0399387 A1 Dec. 15, 2022

(30) Foreign Application Priority Data

Jun. 15, 2021 (KR) ........................ 10-2021-0077420
Oct. 29, 2021 (KR) ........................ 10-2021-0147164

(51) Int. Cl.
*H10F 39/18* (2025.01)
*H10F 39/00* (2025.01)

(52) U.S. Cl.
CPC ....... *H10F 39/8053* (2025.01); *H10F 39/182* (2025.01); *H10F 39/8063* (2025.01)

(58) Field of Classification Search
CPC .... H10F 39/8037; H10F 39/199; H10F 30/21; H10F 30/221; H10F 30/2218;
(Continued)

(56) References Cited

U.S. PATENT DOCUMENTS 8,816,358 B1 8/2014 Tsai et al.
9,645,075 B2 5/2017 Choi
(Continued)

FOREIGN PATENT DOCUMENTS

EP 3805821 A1 4/2021
EP 3 993 044 A1 5/2022
(Continued)

OTHER PUBLICATIONS

Miyata et al., "High-Sensitivity Color Imaging Using Pixel-Scale Color Splitters Based on Dielectric Metasurfaces", 2019, ACS Photonics, vol. 6, 10 pages total.
(Continued)

*Primary Examiner* — Moin M Rahman
(74) *Attorney, Agent, or Firm* — Sughrue Mion, PLLC

(57) ABSTRACT

An image sensor includes a sensor substrate including a plurality of pixels configured to sense light; a color separation lens array including a plurality of pixel corresponding regions facing the plurality of pixels, wherein each pixel corresponding region of the plurality of pixel corresponding regions includes one or more nanoposts, and the one or more nanoposts are configured to form a phase profile that separates incident light for each wavelength, and to concentrate light in different wavelength bands on the plurality of pixels; and a filter array positioned between the sensor substrate and the color separation lens array, and including a plurality of transparent regions alternatingly arranged with a plurality of filters corresponding to a single color.

20 Claims, 30 Drawing Sheets

(58) Field of Classification Search

CPC .... H10F 30/26; H10F 39/802; H10F 39/8057; H10F 39/8067; H10F 77/40; H10F 39/18–1898; H10F 39/182–1825; H10F 39/184–1847; H10F 39/186–1865; H10F 39/189–1898; H10F 30/288; H10F 30/289; H10F 77/12–1285; H10F 71/00–1395; H10F 77/933; H10F 77/957–959; H10F 77/50; H10F 77/496; H10F 77/413; H10F 77/407; H10F 77/703; H10F 77/707; H10F 39/8053; H10F 39/8063; H10F 39/803; H10F 39/804; H10F 39/807; H10F 39/809; G01S 7/4863; G01S 17/10; G01S 17/894; H10K 30/88; H10K 30/87; G02B 1/002; G02B 3/0056; G02B 5/1809; G02B 5/1871; G02B 5/201; H04N 23/57; H04N 25/134

See application file for complete search history.

(56) References Cited

U.S. PATENT DOCUMENTS

| | | | | |
|---|---|---|---|---|
| 10,840,293 | B2 | 11/2020 | Hsieh et al. | |
| 10,868,052 | B2 | 12/2020 | Ootsuka | |
| 10,964,744 | B1 | 3/2021 | Zhao et al. | |
| 10,965,917 | B2 | 3/2021 | Ahmed et al. | |
| 2017/0098672 | A1 | 4/2017 | Yun et al. | |
| 2017/0261368 | A1* | 9/2017 | Nam | G02B 1/002 |
| 2017/0330905 | A1* | 11/2017 | Tak | H10F 39/8053 |
| 2021/0057475 | A1 | 2/2021 | Yamazaki et al. | |
| 2021/0098519 | A1 | 4/2021 | Hsu et al. | |
| 2021/0124179 | A1 | 4/2021 | Yun et al. | |
| 2021/0125301 | A1 | 4/2021 | Park et al. | |
| 2021/0126035 | A1* | 4/2021 | Roh | G02B 1/002 |

FOREIGN PATENT DOCUMENTS

| | | | |
|---|---|---|---|
| KR | 10 2011 0073688 | A | 6/2011 |
| KR | 10 2017 0007706 | A | 1/2017 |
| KR | 10 2017 0041089 | A | 4/2017 |
| KR | 10 2021 0048399 | A | 5/2021 |

OTHER PUBLICATIONS

Chuanlin Li et al., "Dielectric metasurfaces: From wavefront shaping to quantum platforms", Progress in Surface Science, vol. 95, No. 2, Jun. 28, 2020, XP086218733, DOI: 10.1016/J.PROGSURF.2020.100584, (39 total pages).

Communication dated Oct. 31, 2022 issued by the European Patent Office in European Patent Application No. 22179166.8.

Communication dated Mar. 28, 2025, issued by the European Patent Office in European Application No. 22179166.8.

Communication dated Dec. 22, 2025 issued by the Korean Ministry of Intellectual Property in Korean Patent Application No. 10-2021-0147164.

* cited by examiner

130

| 131 | 132 | 131 | 132 | 131 | 132 | 131 | 132 |
| 133 | 134 | 133 | 134 | 133 | 134 | 133 | 134 |
| 131 | 132 | 131 | 132 | 131 | 132 | 131 | 132 |
| 133 | 134 | 133 | 134 | 133 | 134 | 133 | 134 |
| 131 | 132 | 131 | 132 | 131 | 132 | 131 | 132 |
| 133 | 134 | 133 | 134 | 133 | 134 | 133 | 134 |

Y

Z X

170

| GF | BW | GF | BW | GF | BW | GF | BW |
| BW | GF | BW | GF | BW | GF | BW | GF |
| GF | BW | GF | BW | GF | BW | GF | BW |
| BW | GF | BW | GF | BW | GF | BW | GF |
| GF | BW | GF | BW | GF | BW | GF | BW |
| BW | GF | BW | GF | BW | GF | BW | GF |

110

| | | | | | | | |
|---|---|---|---|---|---|---|---|
| 111 | 112 | 111 | 112 | 111 | 112 | 111 | 112 |
| 113 | 114 | 113 | 114 | 113 | 114 | 113 | 114 |
| 111 | 112 | 111 | 112 | 111 | 112 | 111 | 112 |
| 113 | 114 | 113 | 114 | 113 | 114 | 113 | 114 |
| 111 | 112 | 111 | 112 | 111 | 112 | 111 | 112 |
| 113 | 114 | 113 | 114 | 113 | 114 | 113 | 114 |

Y

Z  X

PHASE

PPG1

$2\pi$ $\pi$

PHASE

PPB $2\pi$ $\pi$

1100

| 131 | 132 | 131 | 132 | 131 | 132 | 131 | 132 |

NP — 130

— 120

— 170

GF | BW | GF | BW | GF | BW | GF | BW

111 | 112 | 111 | 112 | 111 | 112 | 111 | 112 — 110

1101

115

| | | | |
|---|---|---|---|
| 111a 111b<br>111<br>111c 111d | 112a 112b<br>112<br>112c 112d | 111a 111b<br>111<br>111c 111d | 112a 112b<br>112<br>112c 112d |
| 113a 113b<br>113<br>113c 113d | 114a 114b<br>114<br>114c 114d | 113a 113b<br>113<br>113c 113d | 114a 114b<br>114<br>114c 114d |
| 111a 111b<br>111<br>111c 111d | 112a 112b<br>112<br>112c 112d | 111a 111b<br>111<br>111c 111d | 112a 112b<br>112<br>112c 112d |
| 113a 113b<br>113<br>113c 113d | 114a 114b<br>114<br>114c 114d | 113a 113b<br>113<br>113c 113d | 114a 114b<br>114<br>114c 114d |

1106

PXG1  PXG2

| R | G | R | G | R | G | R | G | R |
| G | R | G | R | G | R | G | R | G |
| R | G | R | G | R | G | R | G | R |
| G | B | G | B | G | B | G | B | G |
| B | G | B | G | B | G | B | G | B |
| G | B | G | B | G | B | G | B | G |
| R | G | R | G | R | G | R | G | R |
| G | R | G | R | G | R | G | R | G |
| R | G | R | G | R | G | R | G | R |

PXG3
PXG4

Y
Z  X

IMAGE SENSOR INCLUDING COLOR SEPARATION LENS ARRAY AND ELECTRONIC APPARATUS INCLUDING THE IMAGE SENSOR

CROSS-REFERENCE TO RELATED APPLICATIONS

This application is based on and claims priority under 35 U.S.C. § 119 to Korean Patent Application No. 10-2021-0077420, filed on Jun. 15, 2021, and Korean Patent Application No. 10-2021-0147164, filed on Oct. 29, 2021, in the Korean Intellectual Property Office, the disclosures of which are incorporated by reference herein in their entireties.

BACKGROUND

The present disclosure relates to an image sensor including a color separation lens array capable of separating and concentrating incident light for each wavelength, and an electronic apparatus including the image sensor.

An image sensor may sense colors of incident light by using a color filter. However, because a color filter absorbs light of colors other than light of a corresponding light, the light use efficiency of the image sensor may be reduced. For example, when a red-green-blue (RGB) color filter is used, only ⅓ of incident light is transmitted and the remaining ⅔ of the incident light is absorbed, and thus, the light use efficiency of the image sensor is only about 33%. Therefore, in the case of a color display apparatus or a color image sensor, most of light loss occurs in a color filter. Accordingly, a method of efficiently separating colors without using a color filter in an image sensor is continuously being sought.

SUMMARY

Provided are an image sensor with an improved light use efficiency by using a color separation lens array capable of separating and concentrating incident light for each wavelength, and an electronic apparatus including the image sensor.

In accordance with an aspect of the disclosure, an image sensor includes a sensor substrate including a plurality of pixels configured to sense light; a color separation lens array including a plurality of pixel corresponding regions facing the plurality of pixels, wherein each pixel corresponding region of the plurality of pixel corresponding regions includes one or more nanoposts, and the one or more nanoposts are configured to form a phase profile that separates incident light for each wavelength, and to concentrate light in different wavelength bands on the plurality of pixels; and a filter array positioned between the sensor substrate and the color separation lens array, and including a plurality of transparent regions alternatingly arranged with a plurality of filters corresponding to a single color.

In accordance with an aspect of the disclosure, an electronic apparatus includes an image sensor configured to convert an optical image into an electrical signal, including a sensor substrate including a plurality of pixels configured to sense light, a color separation lens array including a plurality of pixel corresponding regions facing the plurality of pixels, wherein each pixel corresponding region of the plurality of pixel corresponding regions includes one or more nanoposts, and the one or more nanoposts are configured to form a phase profile that separates incident light for each wavelength, and to concentrate light in different wavelength bands on the plurality of pixels, and a filter array positioned between the sensor substrate and the color separation lens array, and including a plurality of transparent regions alternately arranged with a plurality of filters corresponding to a single color; and a processor configured to control an operation of the image sensor and to store and output a signal generated by the image sensor.

In accordance with an aspect of the disclosure, an image sensor includes a sensor substrate including a plurality of pixels; a lens array including one or more nanoposts configured modify a phase profile of light incident on the lens array in order to concentrate light having a particular wavelength onto a pixel of the plurality of pixels; and a filter array positioned between the sensor substrate and the lens array, and including a plurality of transparent regions and a plurality of filters corresponding to a single color.

BRIEF DESCRIPTION OF THE DRAWINGS

Embodiments of the present disclosure will be more clearly understood from the following detailed description taken in conjunction with the accompanying drawings in which.

DETAILED DESCRIPTION

Figure 1:
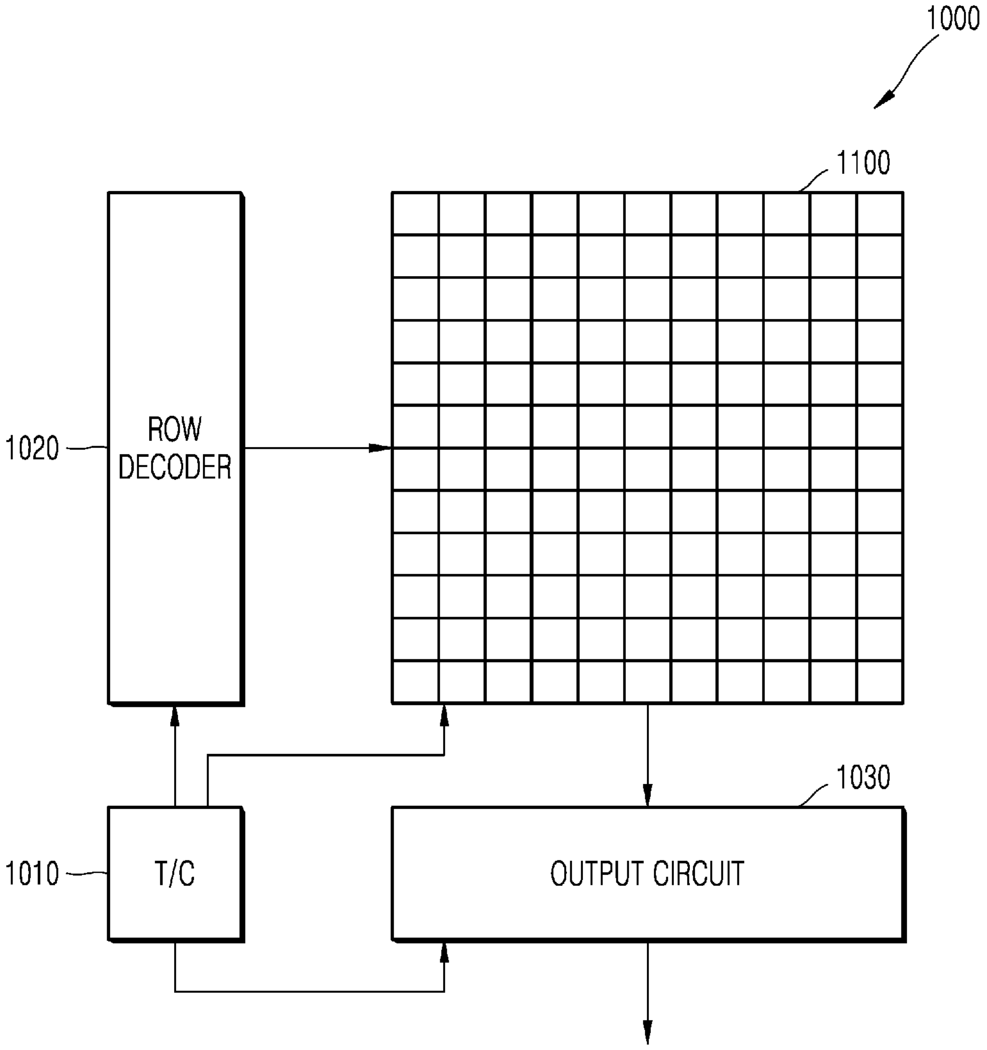
FIG. 1 is a block diagram of an image sensor, according to an embodiment.

Hereinafter, an image sensor including a color separation lens array and an electronic apparatus including the image sensor will be described in detail with reference to the accompanying drawings. Embodiments to be described are merely for illustrative purposes, and various modifications may be made from the embodiments. In the following drawings, the same reference numerals denote the same components, and the size of each component may be exaggerated for clarity and convenience of description.

As used in the following description, when a component is referred to as being "above" or "on" another component, it may not only mean that the component is directly above/below or on the left/right of the other component in contact with the other component, but also mean that the component is above/below or on the left/right of the other component while not in contact with the other component.

Expressions such as "first", "second", and the like may be used to describe various components, but are merely used to distinguish one component from another. These terms do not limit the differences in material or structure of the components.

An expression used in the singular may encompass the expression in the plural, unless it has a clearly different meaning in the context. In addition, when a part "includes" a certain component, the part may further include another component instead of excluding the other component, unless otherwise stated.

Also, terms " . . . er/or", "module", etc. used herein denote units processing one or a plurality of functions or operations, which may be implemented as hardware or software, or a combination of hardware and software.

A term "the" and similar referential terms may be used in both singular and plural forms.

As is traditional in the field, the embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the present scope. Further, the blocks, units and/or modules of the embodiments may be physically combined into more complex blocks, units and/or modules without departing from the present scope.

FIG. 1 is a block diagram of an image sensor, according to an embodiment.

Referring to FIG. 1, an image sensor 1000 may include a pixel array 1100, a timing controller 1010, a row decoder 1020, and an output circuit 1030. The image sensor 1000 may be a charge-coupled device (CCD) image sensor or a complementary metal oxide semiconductor (CMOS) image sensor.

The pixel array 1100 includes pixels two-dimensionally arranged along a plurality of rows and a plurality of columns. The row decoder 1020 selects one of the rows of the pixel array 1100 in response to a row address signal output from the timing controller 1010. The output circuit 1030 outputs a light sensing signal in units of columns from a plurality of pixels arranged along the selected row. To this end, the output circuit 1030 may include a column decoder and an analog-to-digital converter (ADC). For example, the output circuit 1030 may include a plurality of ADCs respectively arranged for each column between the column decoder and the pixel array 1100, or one ADC arranged at an output terminal of the column decoder. The timing controller 1010, the row decoder 1020, and the output circuit 1030 may be implemented as a single chip or as separate chips. A processor for processing an image signal output through the output circuit 1030 may be implemented as a single chip together with the timing controller 1010, the row decoder 1020, and the output circuit 1030.

The pixel array 1100 may include a plurality of pixels for sensing light having different wavelengths. An arrangement of the pixels may be implemented in various manners.

Figure 2A:
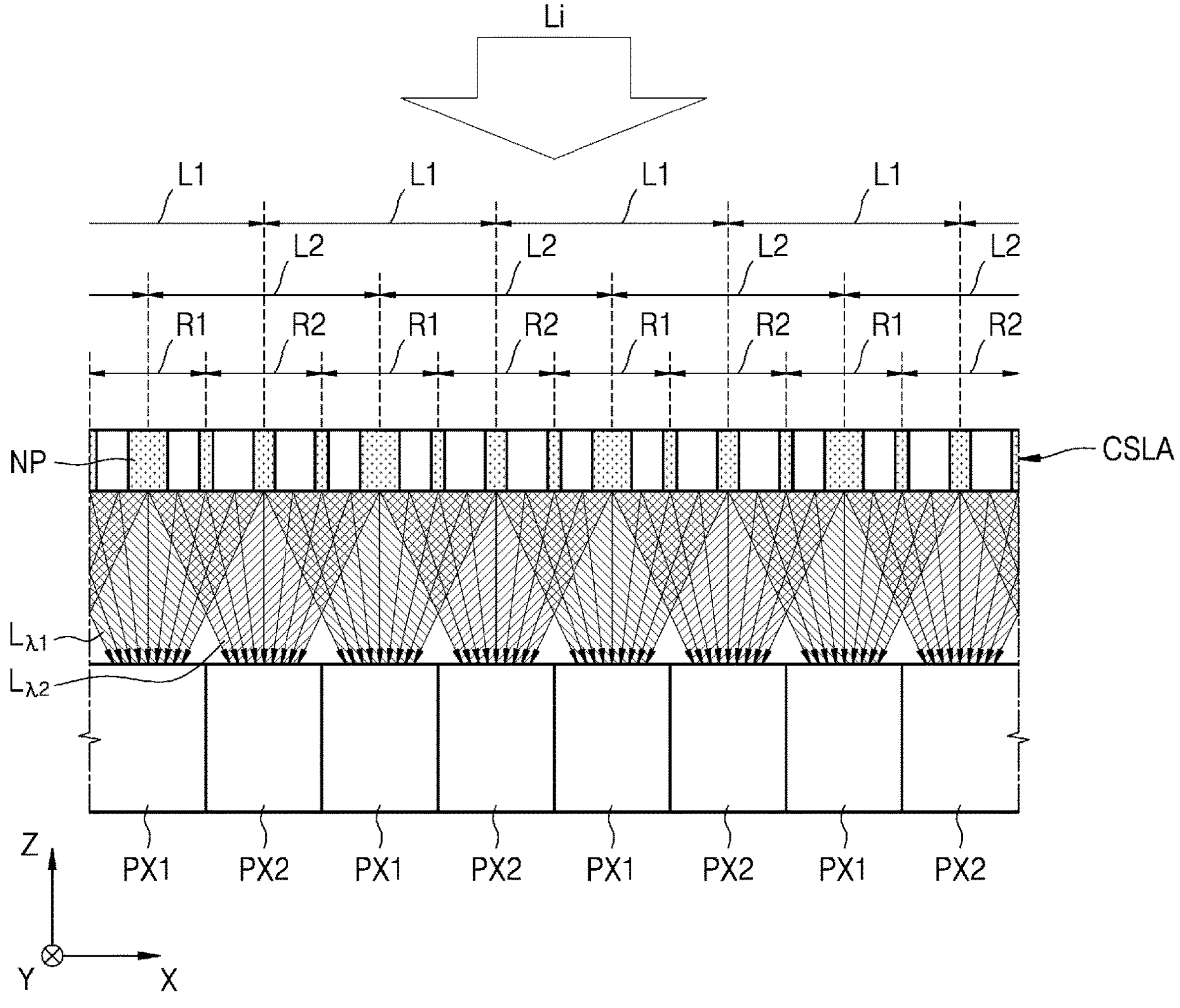
FIGS. 2A and 2B are schematic conceptual diagrams of a structure and an operation of a color separation lens array provided in an image sensor, according to an embodiment.
Figure 2B:
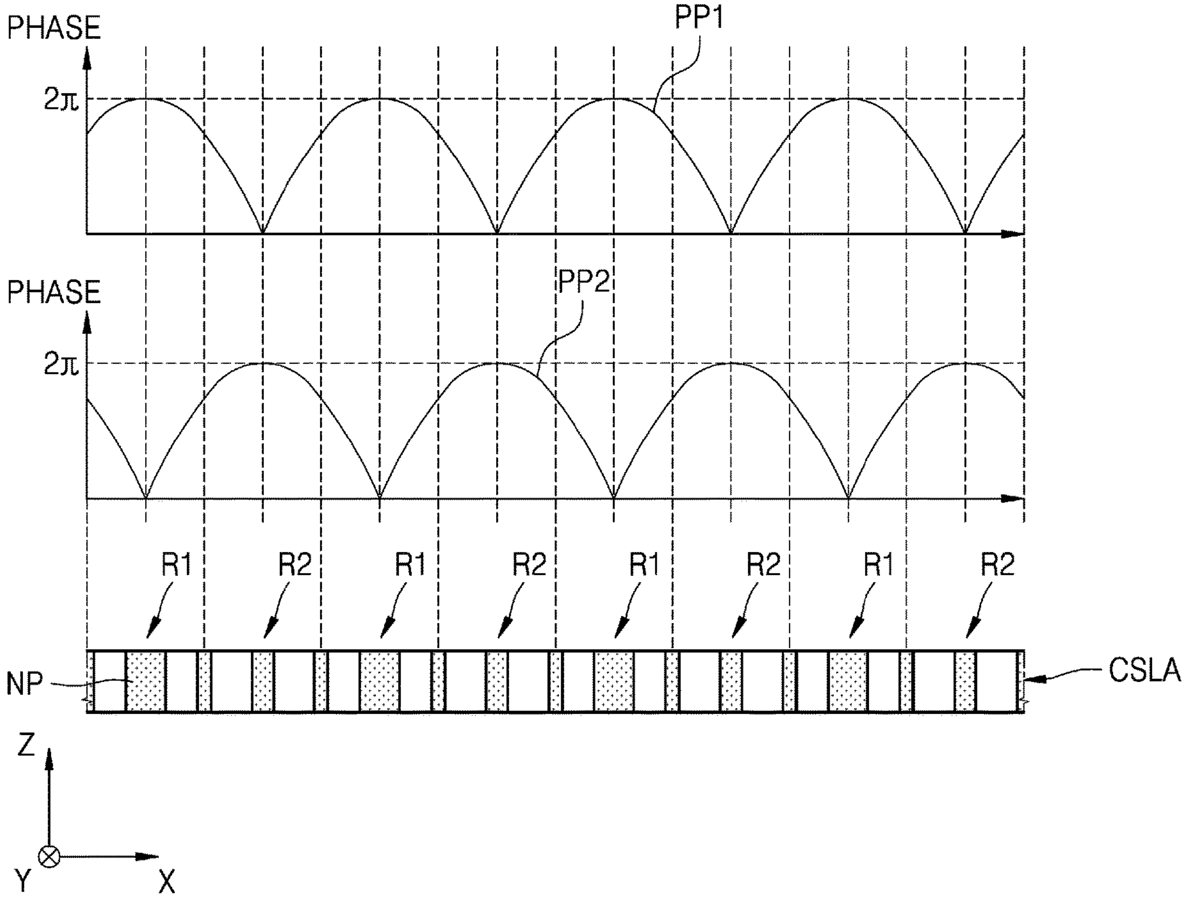

FIGS. 2A and 2B are schematic conceptual diagrams of a structure and an operation of a color separation lens array provided in an image sensor, according to an embodiment.

Referring to FIG. 2A, a color separation lens array CSLA may include a plurality of nanoposts NP that change a phase of incident light Li differently depending on incident positions. The color separation lens array CSLA may be partitioned in various manners. For example, the color separation lens array CSLA may be partitioned into a first pixel corresponding region R1, which corresponds to a first pixel PX1 on which first wavelength light $L_{\lambda 1}$ included in the incident light Li may be concentrated, and a second pixel corresponding region R2, which corresponds to a second pixel PX2 on which second wavelength light $L_{\lambda 2}$ included in the incident light Li may be concentrated. The first and second pixel corresponding regions R1 and R2 may each include at least one nanopost NP and may be arranged to face the first and second pixels PX1 and PX2, respectively. As another example, the color separation lens array CSLA may be partitioned into a first wavelength concentration region L1 for concentrating the first wavelength light $L_{\lambda 1}$ on the first pixel PX1, and a second wavelength concentration region L2 for concentrating the second wavelength light $L_{\lambda 2}$ on the second pixel PX2. The first wavelength concentration region L1 may partially overlap with the second wavelength concentration region L2.

The color separation lens array CSLA may concentrate the first wavelength light $L_{\lambda 1}$ on the first pixel PX1 and concentrate the second wavelength light $L_{\lambda 2}$ on the second pixel PX2 by forming different phase profiles in the first and second wavelength light $L_{\lambda 1}$ and $L_{\lambda 2}$ included in the incident light Li.

For example, referring to FIG. 2B, the color separation lens array CSLA may concentrate the first and second wavelength light $L_{\lambda 1}$ and $L_{\lambda 2}$ on the first and second pixels PX1 and PX2 corresponding thereto, by allowing the first wavelength light $L_{\lambda 1}$ to have a first phase profile PP1 and allowing the second wavelength light $L_{\lambda 2}$ to have a second phase profile PP2 at a position immediately after passing through the color separation lens array CSLA, for example, at a lower surface position of the color separation lens array CSLA. For example, the first wavelength light $L_{\lambda 1}$ passing through the color separation lens array CSLA may have the first phase profile PP1 that is greatest at the center of the first pixel corresponding region R1 and decreases in a direction away from the center of the first pixel corresponding region R1, for example, in a direction of the second pixel corresponding region R2. Such a phase profile may be similar to a phase profile of light converging to a point through a convex lens, for example, a microlens having a convex center, the microlens being arranged in the first wavelength concentration region L1. As a result, the first wavelength light $L_{\lambda 1}$ may concentrate on the first pixel PX1. Also, the second wavelength light $L_{\lambda 2}$ passing through the color separation lens array CSLA may have the second phase profile PP2 that is greatest at the center of the second pixel corresponding region R2 and decreases in a direction away from the center of the second pixel corresponding region R2, for example, in a direction of the first pixel corresponding region R1. As a result, the second wavelength light $L_{\lambda 2}$ may concentrate on the second pixel PX2.

Because a refractive index of a material appears differently depending on wavelengths of light to which the material reacts, as illustrated in FIG. 2B, the color separation lens array CSLA may provide different phase profiles for the first and second wavelength light $L_{\lambda 1}$ and $L_{\lambda 2}$. In other words, the same material may have a different refractive index depending on wavelengths of light reacting with the material, and a phase delay experienced by light when the light passes through the material may also be different for each wavelength, and thus, a different phase profile may be formed for each wavelength. For example, because a refractive index of the first wavelength light $L_{\lambda 1}$ of the first pixel corresponding region R1 may be different from a refractive index of the second wavelength light $L_{\lambda 2}$ of the first pixel corresponding region R1, and a phase delay experienced by the first wavelength light $L_{\lambda 1}$ passing through the first pixel corresponding region R1 may be different from a phase delay experienced by the second wavelength light $L_{\lambda 2}$ passing through the first pixel corresponding region R1, when the color separation lens array CSLA is designed considering such characteristics of light, different phase profiles may be provided for the first and second wavelength light $L_{\lambda 1}$ and $L_{\lambda 2}$.

The color separation lens array CSLA may include nanoposts NP arranged according to specific rules so that the first and second wavelength light $L_{\lambda 1}$ and $L_{\lambda 2}$ have the first and second phase profiles PP1 and the PP2, respectively. In this case, the rules may be applied to parameters such as a shape, a size (for example width and height), a distance, and an arrangement form of a nanopost NP, and the parameters may be determined according to a phase profile to be implemented by using the color separation lens array CSLA.

A rule for arranging the nanopost NP in the first pixel corresponding region R1 may be different from a rule for arranging the nanopost NP in the second pixel corresponding region R2. In other words, a size, a shape, a distance, and/or an arrangement of the nanopost NP provided in the first pixel corresponding region R1 may be different from a size, a shape, a distance, and/or an arrangement of the nanopost NP provided in the second pixel corresponding region R2.

The nanopost NP may have a shape dimension of a sub-wavelength. In this case, the sub-wavelength may refer to a wavelength less than a wavelength in a wavelength band of light, which is an object to diverge. The nanopost NP may have a dimension, for example, less than a shorter wavelength between a first wavelength λ1 and a second wavelength λ2. The nanopost NP may have a cylindrical shape having a diameter of a cross-section of the sub-wavelength. However, the shape of the nanopost NP is not limited thereto. When the incident light Li is visible light, a diameter of a cross-section of the nanopost NP may have a dimension of, for example, less than 400 nm, 300 nm, or 200 nm. A height of the nanopost NP may be about 500 nm to about 1500 nm and may be greater than the diameter of the cross-section of the nanopost NP. In embodiments, the nanopost NP may be obtained by combining at least two posts stacked in a height direction, which may be for example a Z-direction.

The nanopost NP may include a material having a refractive index higher than that of a surrounding material. For example, the nanopost NP may include crystalline silicon (c-Si), polycrystalline silicon (p-Si), amorphous silicon (a-Si), III-V compound semiconductors (gallium phosphide (GaP), gallium nitride (GaN), gallium arsenide (GaAs), etc.), silicon carbide (SiC), titanium dioxide ($TiO_2$), silicon nitride (SiN), and/or any combination thereof The nanopost NP having a different refractive index from that of the surrounding material may change a phase of light passing through the nanopost NP. This is due to a phase delay caused by the shape dimension of the sub-wavelength of the nanopost NP, and a degree to which a phase is delayed is determined according to a detailed shape dimension and an arrangement form of the nanopost NP. The surrounding material of the nanopost NP may include a dielectric material having a refractive index lower than that of the nanopost NP. For example, the surrounding material may include silicon dioxide ($SiO_2$) or air.

Region division of the color separation lens array CSLA and shapes and an arrangement of the nanoposts NP may be set to form a phase profile that separates incident light according to wavelengths and concentrates the separated light on a plurality of pixels, for example, the first and second pixels PX1 and PX2. Such a wavelength separation may include, but is not limited to, color separation in a visible light band, and a wavelength band may be expanded to a range of visible light to infrared (IR) light, or various other ranges. The first wavelength λ1 and the second wavelength λ2 may be in an IR wavelength band to a visible wavelength band, but are not limited thereto, and may include various wavelength bands according to arrangement rules of an array of a plurality of nanoposts NP. Also, although embodiments discussed above relate to two wavelengths which diverge and concentrate, embodiments are not limited thereto, and in embodiments incident light may diverge in at least three directions according to wavelengths and then concentrate.

In addition, although embodiments discussed above relate to an example of the color separation lens array CSLA which has a structure in which the nanoposts NP are arranged in a single layer, embodiments are not limited thereto, and the color separation lens array CSLA may also have a stacked structure in which the nanoposts NP are arranged in a plurality of layers.

The wavelength separation caused by the color separation lens array CSLA may include crosstalk depending on designs and process errors. For example, light having wavelengths other than a corresponding wavelength may be incident to a target pixel. In an embodiment, the image sensor uses, together with a color separation lens array, a filter array having a structure that minimizes additional processes while maximizing color separation efficiency by reducing crosstalk. The filter array may be variously implemented to suit a pixel arrangement and a corresponding wavelength separation form of the color separation lens array CSLA.

Figure 3:
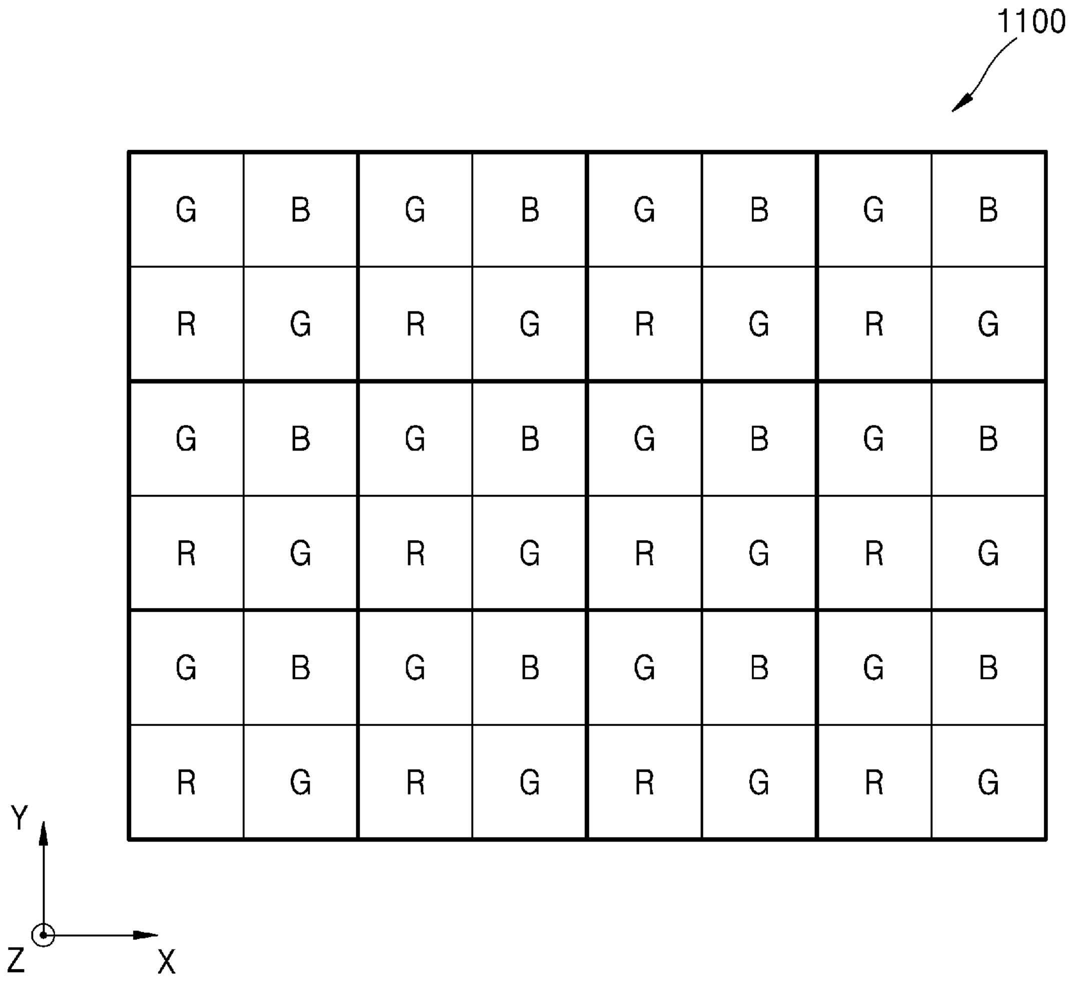
FIG. 3 is a plan view of a color arrangement represented by a pixel array of an image sensor, according to an embodiment.

FIG. 3 is a plan view of a color arrangement represented by a pixel array of an image sensor, according to an embodiment.

The illustrated pixel arrangement is an arrangement of a Bayer pattern which may be used in the image sensor 1000. As illustrated in FIG. 3, one unit pattern includes four quadrant regions, and a first quadrant region to a fourth quadrant region may be a blue pixel B, a green pixel G, a red pixel R, and a green pixel G, respectively. Such unit patterns are two-dimensionally and repeatedly arranged in a first direction, which may be, for example, an X-direction, and a second direction, which may be, for example, a Y-direction. In other words, in a unit pattern of a 2×2 array type, two green pixels G are arranged in one diagonal direction, and one blue pixel B and one red pixel R are arranged in another diagonal direction. Considering an overall pixel arrangement, a first row in which a plurality of green pixels G are alternately arranged with a plurality of blue pixels B in the first direction and a second row in which a plurality of red pixels R are alternately arranged with a plurality of green pixels G in the first direction are repeatedly arranged in the second direction.

The pixel array 1100 of the image sensor 1000 may include a color separation lens array that concentrates light of a color in response to the color arrangement, for example, a specific pixel. For example, the region division and the shapes and arrangement of the nanoposts NP may be set so that wavelengths separated by the color separation lens array CSLA described with reference to FIGS. 2A and 2B become a red wavelength, a green wavelength, and a blue wavelength.

Figure 4A:
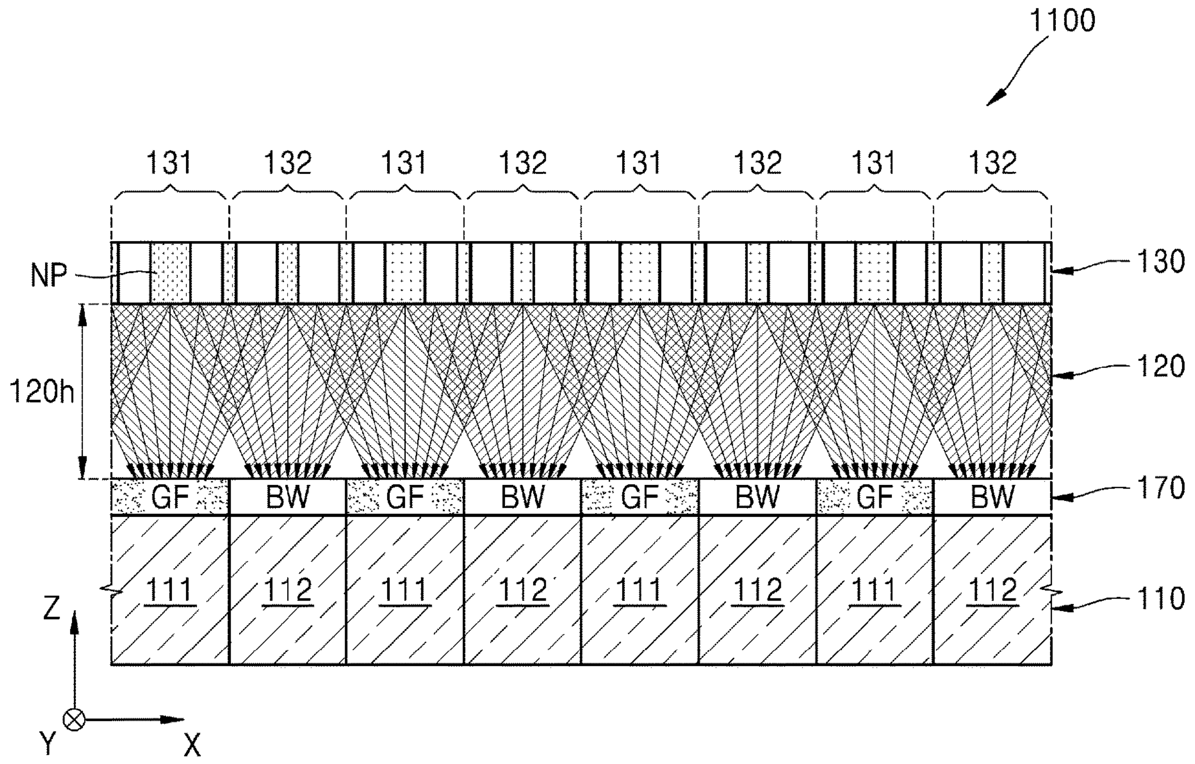
FIGS. 4A and 4B are cross-sectional views illustrating different cross-sections of a pixel array of an image sensor, according to an embodiment.
Figure 4B:
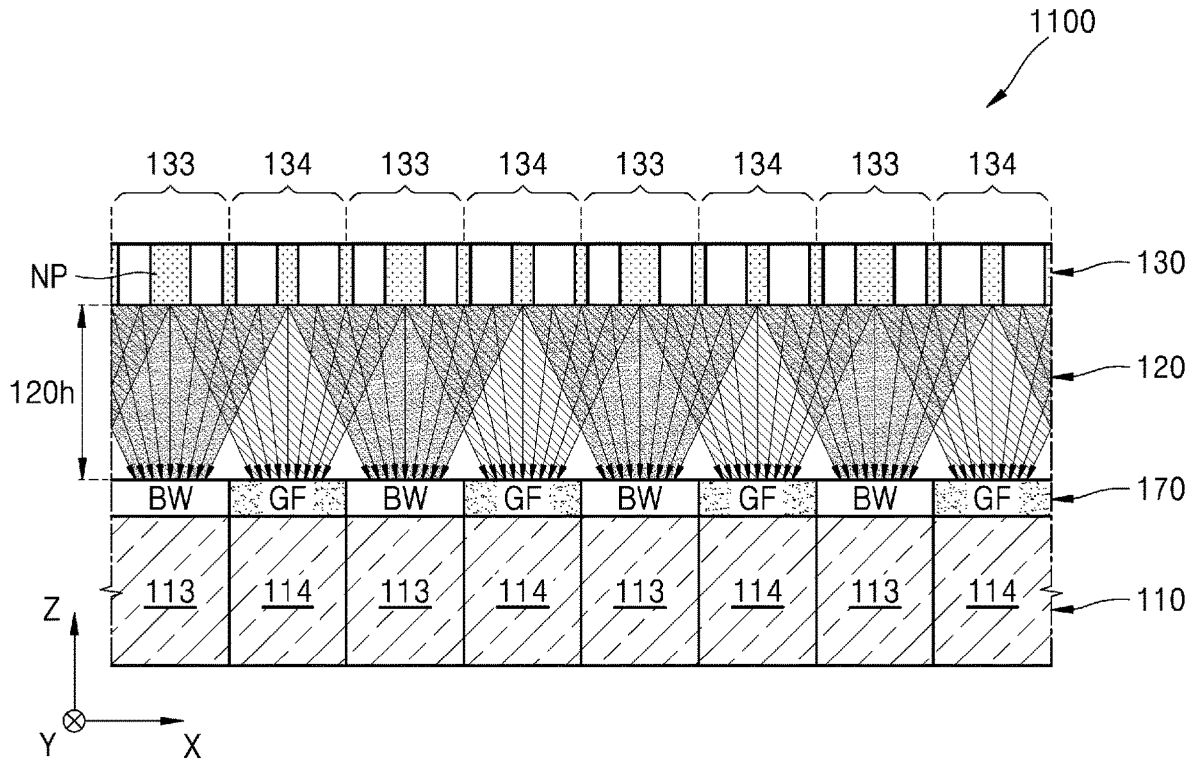
Figure 5A:
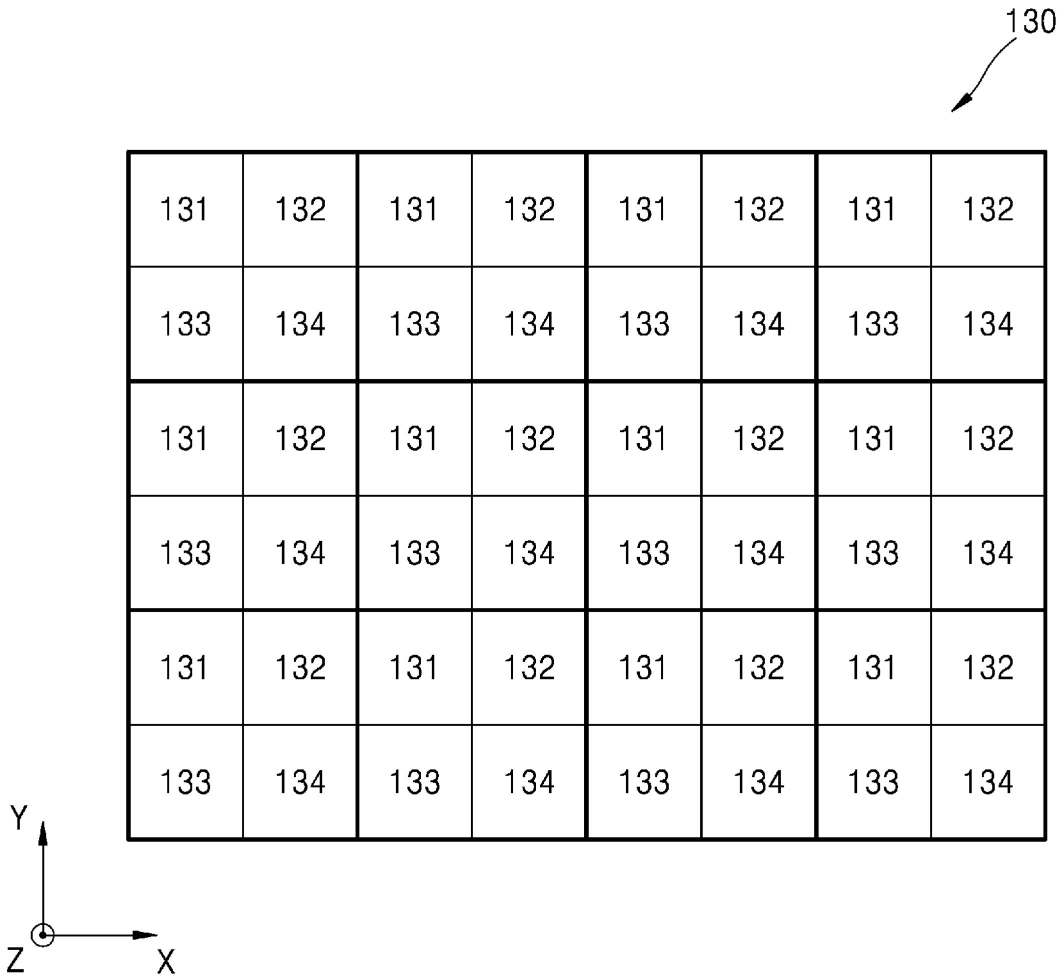
FIG. 5A is a plan view of an arrangement of pixel corresponding regions of a color separation lens array provided in an image sensor, according to an embodiment.
Figure 5B:
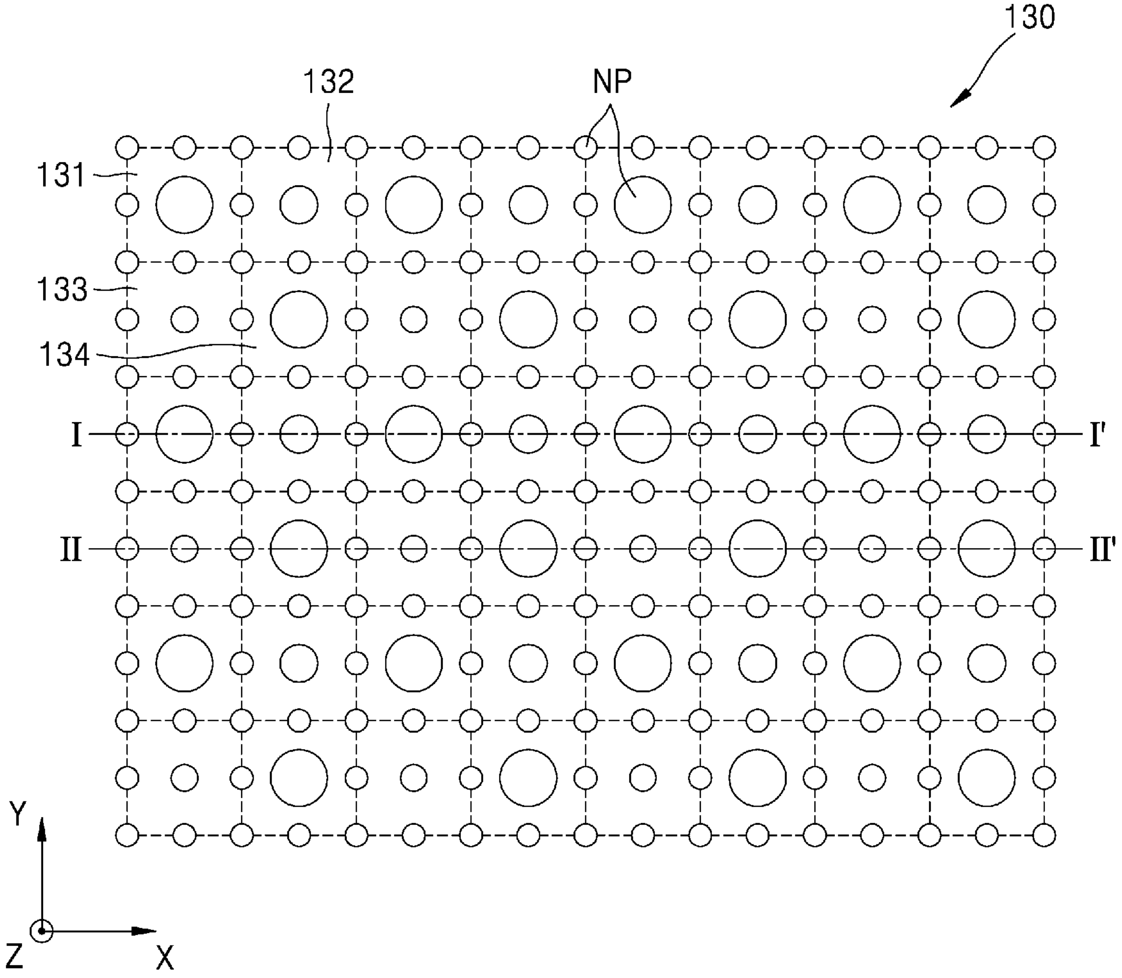
FIG. 5B is a plan view of shapes and an arrangement of nanoposts arranged in the color separation lens array of FIG. 5A, according to an embodiment.
Figure 5C:
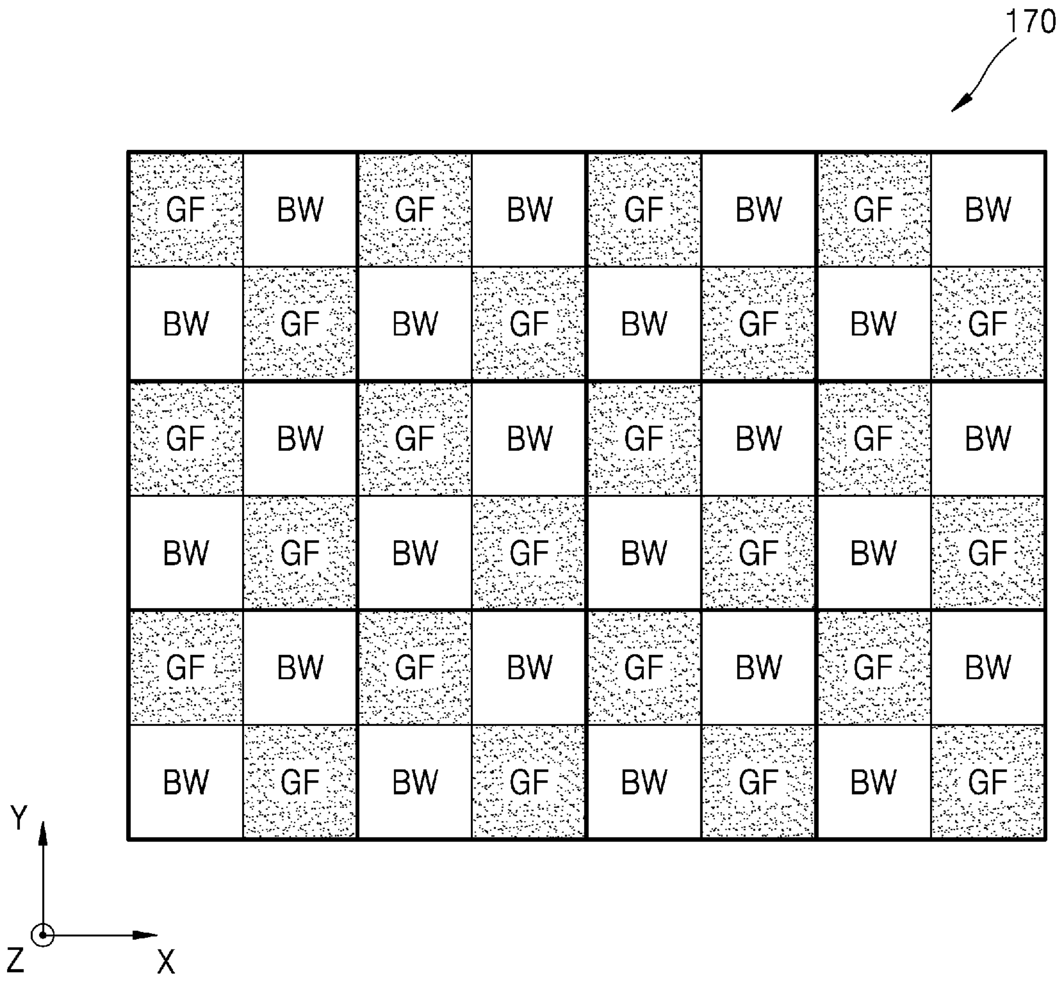
FIG. 5C is a plan view of a filter arrangement of a filter array provided in an image sensor, according to an embodiment.

FIGS. 4A and 4B are cross-sectional views illustrating different cross-sections of the pixel array 1100 of the image sensor 1000 of FIG. 1. FIG. 5A is a plan view of an arrangement of pixel corresponding regions of a color separation lens array 130 provided in the pixel array 1100, and FIG. 5B is a plan view of shapes and an arrangement of nanoposts arranged in the color separation lens array 130 of FIG. 5A. FIG. 5C is a plan view of a filter arrangement of a filter array 170 provided in the pixel array 1100, and FIG. 5D is a plan view of a pixel arrangement of a sensor substrate 110 provided in the pixel array 1100.

Referring to FIGS. 4A and 4B, the pixel array 1100 of the image sensor 1000 includes the sensor substrate 110, the filter array 170, and the color separation lens array 130, the sensor substrate 110 including a plurality of pixels, for example, a first green pixel 111, a blue pixel 112, a red pixel 113, and a second green pixel 114. The filter array 170 may be arranged on the sensor substrate 110, and the color separation lens array 130 may be arranged on the filter array 170. A spacer layer 120 that is transparent may be positioned between the filter array 170 and the color separation lens array 130.

The sensor substrate 110 may include the first green pixel 111, the blue pixel 112, the red pixel 113, and the second green pixel 114, which convert light into an electrical signal. As illustrated in FIGS. 4A, 4B, and 5D, the first green pixel 111 may be alternately arranged with the blue pixel 112 in the first direction (or X-direction) in one cross-section, and the red pixel 113 may be alternately arranged with the second green pixel 114 in a different cross-section having a different position in the second direction (or Y-direction).

Figure 5D:
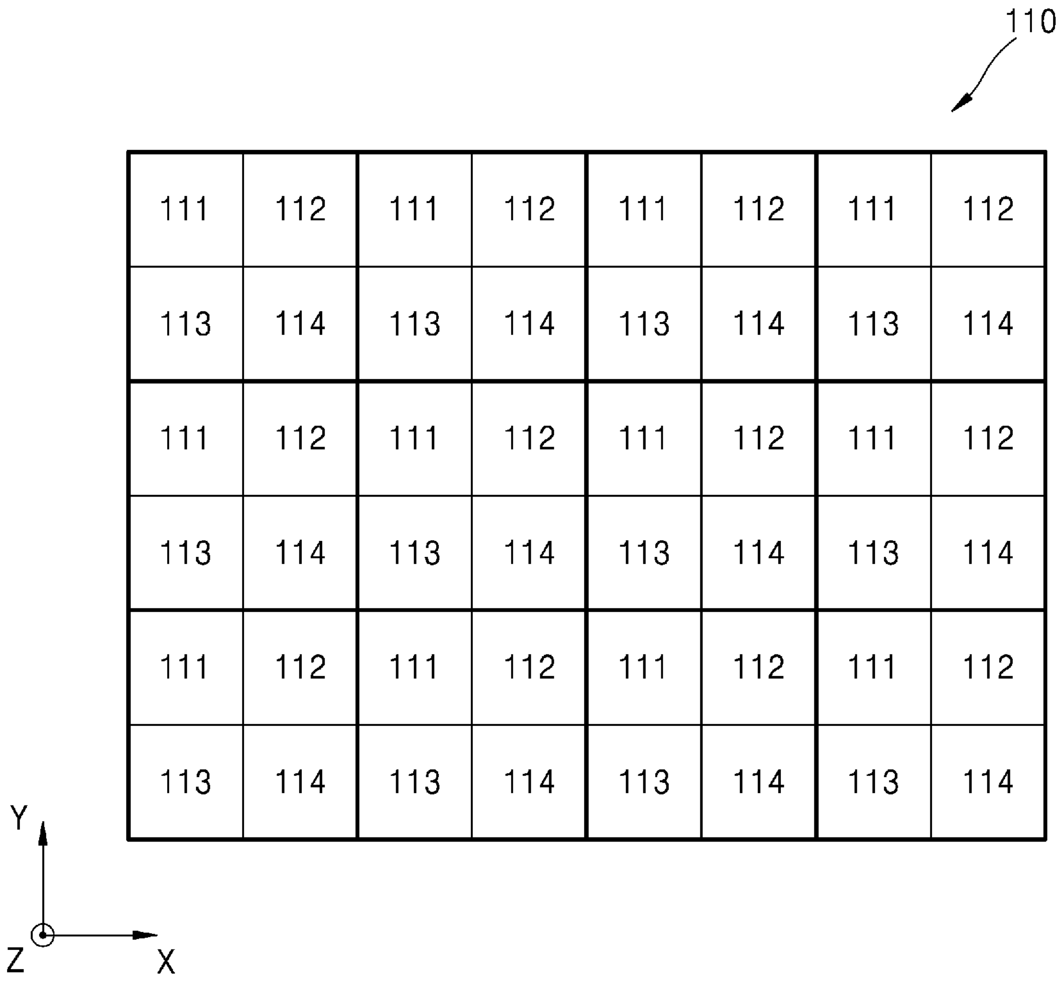
FIG. 5D is a plan view of a pixel arrangement of a sensor substrate provided in an image sensor, according to an embodiment.

The pixel arrangement of the sensor substrate 110 illustrated in FIG. 5D is an arrangement of pixels corresponding to the color arrangement of the Bayer pattern illustrated in FIG. 3. Hereinafter, a pixel arrangement of an image sensor may be interchangeably used with the same meaning as a pixel arrangement of a sensor substrate. The pixel arrangement of the sensor substrate 110 may be used to sense incident light by dividing the incident light into a unit pattern such as the Bayer pattern. For example, the first and second green pixels 111 and 114 may sense green light, the blue pixel 112 may sense blue light, and the red pixel 113 may sense red light. In embodiments, a separator for cell separation may be further formed at a cell boundary.

Referring to FIGS. 4A, 4B, 5A, and 5B, the color separation lens array 130 may be partitioned into four pixel corresponding regions, for example, the first green pixel corresponding region 131, the blue pixel corresponding region 132, the red pixel corresponding region 133, and the second green pixel corresponding region, respectively corresponding to the first green pixel 111, the blue pixel 112, the red pixel 113, and the second green pixel 114 of the sensor substrate 110. A first green pixel corresponding region 131 may correspond to the first green pixel 111 and be arranged above the first green pixel 111, a blue pixel corresponding region 132 may correspond to the blue pixel 112 and be arranged above the blue pixel 112, a red pixel corresponding region 133 may correspond to the red pixel 113 and be arranged above the red pixel 113, and a second green pixel corresponding region 134 may correspond to the second green pixel 114 and be arranged above the second green pixel 114. For example, the first green pixel corresponding region 131, the blue pixel corresponding region 132, the red pixel corresponding region 133, and the second green pixel corresponding region 134 of the color separation lens array 130 may be arranged respectively to face the first green pixel 111, the blue pixel 112, the red pixel 113, and the second green pixel 114 of the sensor substrate 110. The pixel corresponding regions 131, 132, 133, and 134 may be two-dimensionally arranged in the first direction (or X-direction) and a second direction (or Y-direction) so that a first row in which the first green pixel corresponding region 131 is alternately arranged with the blue pixel corresponding region 132 is alternately and repeatedly arranged with a second row in which the red pixel corresponding region 133 is alternately arranged with the second green pixel corresponding region 134. The color separation lens array 130 also includes a plurality of unit patterns two-dimensionally arranged like the sensor substrate 110, and each unit pattern includes pixel corresponding regions 131, 132, 133, and 134 arranged in a 2×2 array type.

In a concept similar to that described with reference to FIG. 2A, in embodiments a region of the color separation lens array 130 may include a green light concentration region that concentrates green light, a blue light concentration region that concentrates blue light, and a red light concentration region that concentrates red light.

The color separation lens array 130 may include nanoposts NP having a predetermined size, shape, distance, and/or arrangement so that the green light diverges and concentrates on the first and second green pixels 111 and 114, the blue light diverges and concentrates on the blue pixel 112, and the red light diverges and concentrates on the red pixel 113. A thickness, for example in a Z-direction, of the color separation lens array 130 may be similar to a height of the nanopost NP and may be about 500 nm to about 1500 nm.

Referring to FIG. 5B, the pixel corresponding regions 131, 132, 133, and 134 may include cylindrical nanoposts NP each having a circular cross-section. In embodiments, nanoposts NP having different cross-sectional areas from each other may be arranged at the centers of regions, and nanoposts NP may also be arranged at the center of a pixel boundary line and an intersection of the pixel boundary line. A cross-sectional area of a nanopost NP arranged at a pixel boundary may be less than that of a nanopost NP arranged at the center of a pixel.

Specifically considering an arrangement of the nanoposts NP included in the pixel corresponding regions 131, 132, 133, and 134 included in a unit pattern, among the nanoposts NP, each of a cross-sectional area of a nanopost NP arranged at the center of the first green pixel corresponding region 131 and a cross-sectional area of a nanopost NP arranged at the center of the second green pixel corresponding region 134 is greater than a cross-sectional area of a nanopost NP arranged at the center of the blue pixel corresponding region 132 or a cross-sectional area of a nanopost NP arranged at the center of the red pixel corresponding region 133, and the cross-sectional area of the nanopost NP arranged at the center of the blue pixel corresponding region 132 is greater than the cross-sectional area of the nanopost NP arranged at the center of the red pixel corresponding region 133. However, this is merely an example, and nanoposts NP having various shapes, sizes, and arrangements may be applied as necessary.

The nanoposts NP provided in the first and second green pixel corresponding regions 131 and 134 may have different profile rules in the first direction (or X-direction) and the second direction (or Y-direction). For example, the nanoposts NP arranged in the first and second green pixel corresponding regions 131 and 134 may have different size arrangements in the first direction (or X-direction) and the second direction (or Y-direction).

In embodiments, the nanoposts NP arranged in the blue pixel corresponding region 132 and the red pixel corresponding region 133 may have the same profile rule in the first direction (or X-direction) and the second direction (or Y-direction).

Nanoposts NP arranged at four corners of each of the pixel corresponding regions 131, 132, 133, and 134, for example, at positions where the four regions intersect, may have the same cross-sectional area.

Such a profile may be due to the pixel arrangement of the Bayer pattern. In both the blue pixel 112 and the red pixel 113, pixels adjacent in the first direction (or X-direction) and the second direction (or Y-direction) are the same as the first and second green pixels 111 and 114. In embodiments, in the first green pixel 111, a pixel adjacent in the first direction (or X-direction) and a pixel adjacent in the second direction (or Y-direction) are respectively the blue pixel 112 and the red pixel 113, which are different from each other. In the second green pixel 114, a pixel adjacent in the first direction (or X-direction) and a pixel adjacent in the second direction (or Y-direction) are respectively the red pixel 113 and the blue pixel 112, which are different from each other. In addition, for the first and second green pixels 111 and 114, pixels adjacent in four diagonal directions are green pixels, for the blue pixel 112, pixels adjacent in four diagonal directions are the same as red pixels 113, and for the red pixel 113, pixels adjacent in four diagonal directions are the same as blue pixels 112. Accordingly, in the blue and red pixel corresponding regions 132 and 133 respectively corresponding to the blue pixel 112 and the red pixel 113, the nanoposts NP may be arranged in a 4-fold symmetric form, and in the first and second green pixel corresponding regions 131 and 134, the nanoposts NP may be arranged in a two-fold symmetric form. In particular, the first and second green pixel corresponding regions 131 and 134 are rotated by 90 degrees with respect to each other.

Although the nanoposts NP illustrated in FIG. 5B are all illustrated to have symmetric circular cross-sectional shapes, some nanoposts having asymmetric cross-sectional shapes may also be included. For example, nanoposts having asymmetric cross-sectional shapes having different widths in the first direction (or X-direction) and the second direction (or Y-direction) may be used in the first and second green pixel corresponding regions 131 and 134, and nanoposts having symmetric cross-sectional shapes having the same width in the first direction (or X-direction) and the second direction (or Y-direction) may be used in the blue and red pixel corresponding regions 132 and 133.

An arrangement rule of the nanoposts NP described above is merely an example for wavelength separation corresponding to the pixel arrangement and is not limited to the illustrated pattern.

Referring to FIGS. 4A, 4B, and 5C, the filter array 170 includes a plurality of transparent regions BW and a plurality of filters of a single color. The plurality of filters GF may be green filters GF that transmit green light and absorb light of different colors. The green filters GF are arranged to face the first and second green pixels 111 and 114 and are also arranged to face the first and second green pixel corresponding regions 131 and 134 of the color separation lens array 130. The transparent regions BW are arranged to face the red pixel 113 and the blue pixel 112 and face the red pixel corresponding region 133 and the blue pixel corresponding region 132 of the color separation lens array 130. The transparent regions BW may include, for example, a transparent resin material.

The filter array 170 may be used to reduce crosstalk that may occur in color separation caused by the color separation lens array 130. Crosstalk may mean that light of colors other than light of a corresponding color is incident on a target pixel in a color separation operation. In particular, because the crosstalk may frequently occur in light in a long wavelength band among wavelength bands on which the color separation lens array 130 performs color separation, a single color and an arrangement position of a filter used in the filter array 170 may be set to prevent the light in the long wavelength band from being incident on pixels other than a corresponding pixel. In the pixel arrangement of the Bayer pattern, green pixels occupy 50% of the total pixels, and accordingly, by using the green filters GF, crosstalk of long-wavelength light may be effectively reduced.

In an embodiment, the filter array 170 provided in the image sensor 1000 may be irrelevant to light loss that occurs when colors are expressed by using only a color filter. Because the filter array 170 removes some crosstalk from colors separated by the color separation lens array 130, the overall color purity may be increased with little decrease in light efficiency. Also, it may be uneconomical to use a color filter including all of red, green, and blue filter regions for this purpose, considering process, cost, and light efficiency. Because each of the red, green, and blue filter regions includes a different material, deposition, photolithography, and etching processes are performed for each material. This is because these sophisticated additional processes may increase cost and lower yields with the trend toward high pixelation with a reduced pixel size and an increased number of pixels. In an embodiment, by using the filter array 170, a decrease in light efficiency and additional processes may be minimized, crosstalk may be reduced, and color purity may be increased.

The spacer layer 120 is positioned between the sensor substrate 110 and the color separation lens array 130 to maintain a constant distance between the sensor substrate 110 and the color separation lens array 130. The spacer layer 120 may include a material transparent to visible light, for example, a dielectric material having a refractive index lower than that of the nanopost NP and having a low absorption factor in a visible light band, such as $SiO_2$ and siloxane-based spin on glass (SOG). A thickness 120*h* of the spacer layer 120 may be selected within a range of $ht-p \leq h \leq ht+p$, where ht is a focal length, generated by the color separation lens array 130, of light having a central wavelength in a wavelength band diverged by the color separation lens array 130, and p is a pixel pitch. In an embodiment, the pixel pitch may be several μm or less, for example, 2 μm or less, 1.5 μm or less, 1 μm or less, or 0.7 μm or less. The pixel pitch may be approximately in a range of about 0.5 μm to about 1.5 μm. The thickness 120*h* of the spacer layer 120 may be designed based on, for example, 540 nm, which is a central wavelength of green light.

In an embodiment, because the filter array 170 is positioned between the sensor substrate 110 and the color separation lens array 130, considering a thickness of the filter array 170, the thickness 120*h* of the spacer layer 120 may be set to be less than a focal length, generated by the color separation lens array 130, of light having a central wavelength in a wavelength band separated by the color separation lens array 130. For example, the thickness 120*h* of the spacer layer 120 may be set to be less than a focal length of green light, by the color separation lens array 130.

The spacer layer 120 may also support the nanoposts NP included in the color separation lens array 130. The spacer layer 120 may include a dielectric material having a refractive index lower than a refractive index of each of the nanoposts NP.

A region between the nanoposts NP may include a dielectric having a refractive index lower than that of each of the nanoposts NP, for example, air or $SiO_2$. In embodiments, a protective layer having a low refractive index in the form of covering side surfaces and upper portions of the nanoposts NP may be further provided.

Figure 6A:
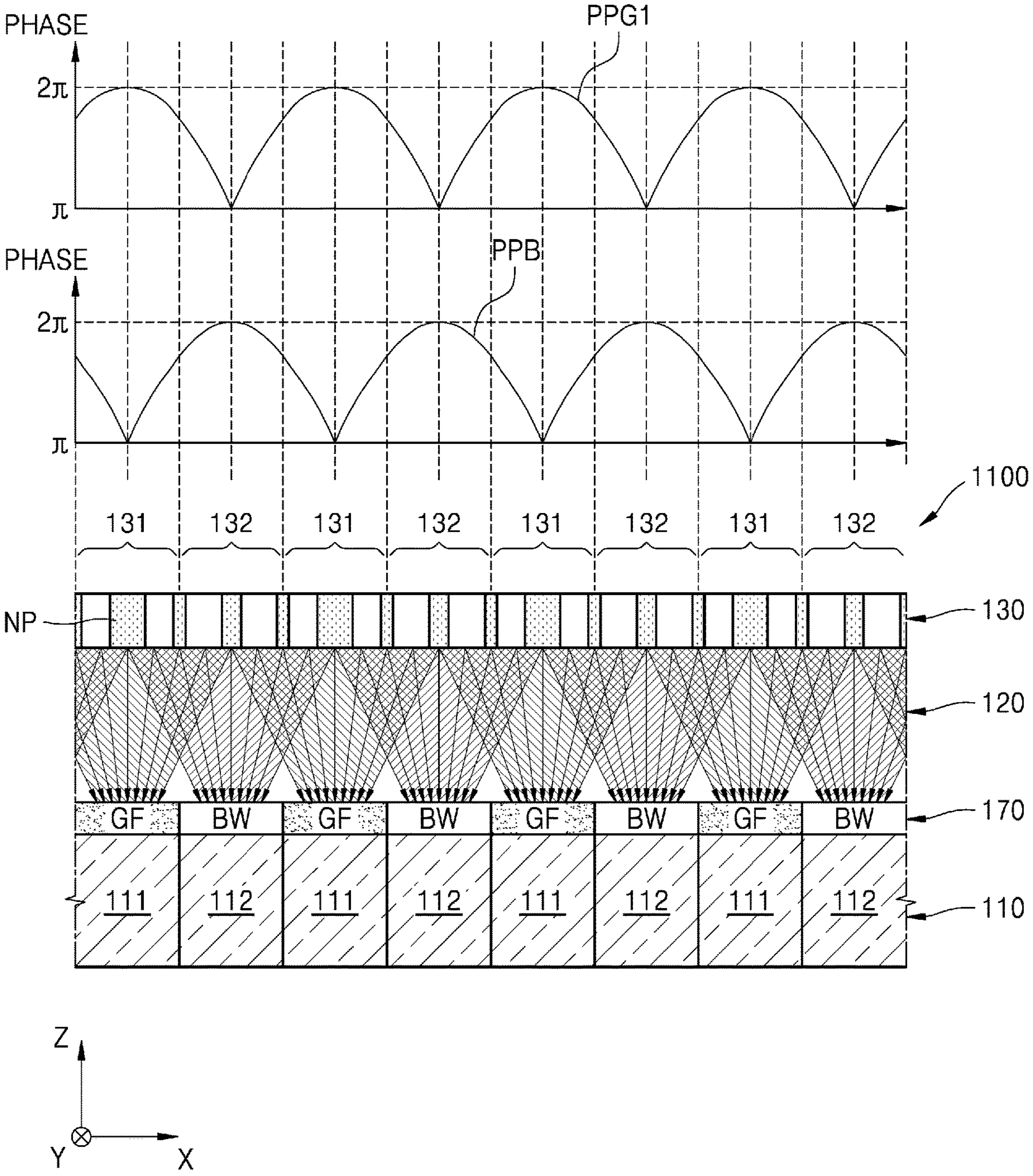
FIG. 6A is a diagram of phase profiles of green light and blue light passing through a color separation lens array, taken along a line I-I' of FIG. 5B, according to an embodiment.
Figure 6B:
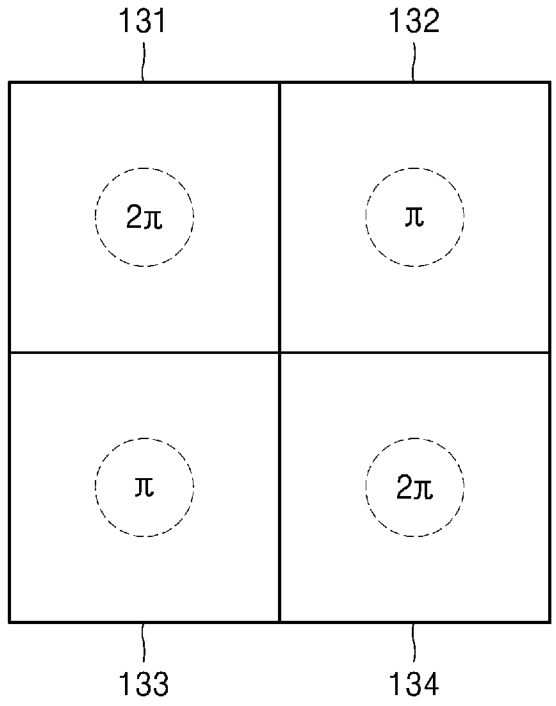
FIG. 6B is a diagram of phases of green light passing through a color separation lens array, at the centers of pixel corresponding regions, according to an embodiment.
Figure 6C:
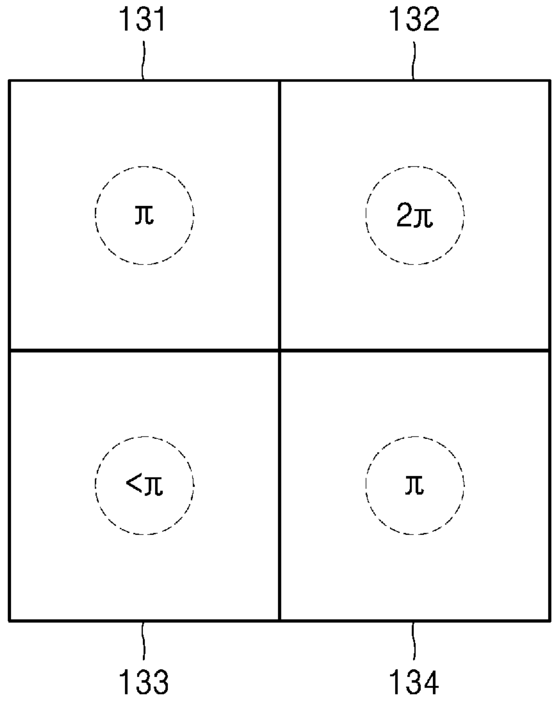
FIG. 6C is a diagram of phases of blue light passing through a color separation lens array, at the centers of pixel corresponding regions, according to an embodiment.

FIG. 6A is a diagram of phase profiles of green light and blue light passing through the color separation lens array 130, taken along a line I-I' of FIG. 5B, FIG. 6B is a diagram of phases of green light passing through the color separation lens array 130, at the centers of pixel corresponding regions 131, 132, 133, and 134, and FIG. 6C is a diagram of phases of blue light passing through the color separation lens array 130, at the centers of pixel corresponding regions 131, 132, 133, and 134. The phase profiles of green light and blue light in FIG. 6A are similar to phase profiles of first wavelength light and second wavelength light described with reference to FIG. 2B.

Referring to FIGS. 6A and 6B, green light passing through the color separation lens array 130 may have a first green light phase profile PPG1 that is greatest at the center of the first green pixel corresponding region 131 and decreases in a direction away from the center of the first green pixel corresponding region 131. For example, at a position immediately after passing through the color separation lens array 130, for example, on a lower surface of the color separation lens array 130 or an upper surface of the spacer layer 120, a phase of green light is greatest at the center of the first green pixel corresponding region 131 and gradually decreases in the form of a concentric circle away from the center of the first green pixel corresponding region 131, and is minimized at the centers of the blue and red pixel corresponding regions 132 and 133 in an X-direction and a Y-direction and minimized at a contact point between the first green pixel corresponding region 131 and the second green pixel corresponding region 134 in a diagonal direction. When a phase of green light is set to 2 π based on a phase of light emitted from the center of the first green pixel corresponding region 131, light having a phase of about 0.9 π to about 1.1 π may be emitted from the centers of the blue and red pixel corresponding regions 132 and 133, light having a phase of 2 π may be emitted from the center of the second green pixel corresponding region 134, and light having a phase of about 1.1 π to about 1.5 π may be emitted from the contact point between the first green pixel corresponding region 131 and the second green pixel corresponding region 134. Accordingly, a phase difference between green light passing through the center of the first green pixel corresponding region 131 and green light passing through the centers of the blue and red pixel corresponding regions 132 and 133 may be about 0.9 π to about 1.1 π.

The first green light phase profile PPG1 does not mean that an amount of a phase delay of light passing through the center of the first green pixel corresponding region 131 is the greatest, and in a case where a phase of light passing through the center of the first green pixel corresponding region 131 is set to 2 π, when a phase delay of light passing through another position is greater and has a phase value greater than 2 π, the phase delay of the other position is a value remaining after 2n π is removed from the phase value, for example, a wrapped phase. For example, in a case where the phase of light passing through the center of the first green pixel corresponding region 131 is 2 π, when a phase of light passing through the center of the blue pixel corresponding region 132 is 3 π, a phase at the center of the blue pixel corresponding region 132 may be it remaining after 2 π (where n=1) is removed from 3 π.

Referring to FIGS. 6A and 6C, blue light passing through the color separation lens array 130 may have a blue light phase profile PPB that is greatest at the center of the blue pixel corresponding region 132 and decreases in a direction away from the center of the blue pixel corresponding region 132. For example, at a position immediately after passing through the color separation lens array 130, a phase of blue light is greatest at the center of the blue pixel corresponding region 132 and gradually decreases in the form of a concentric circle away from the center of the blue pixel corresponding region 132, and is minimized at the centers of the first and second green pixel corresponding regions 131 and 134 in the X-direction and the Y-direction and minimized at the center of the red pixel corresponding region 133 in a diagonal direction. When a phase of blue light at the center of the blue pixel corresponding region 132 is 2 π, phases at the centers of the first and second green pixel corresponding regions 131 and 134 may be, for example, about 0.9 π to about 1.1 π, and a phase at the center of the red pixel corresponding region 133 may have a value less than values of phases at the centers of the first and second green pixel corresponding regions 131 and 134, for example, about 0.5 π to about 0.9 π.

Figure 6D:
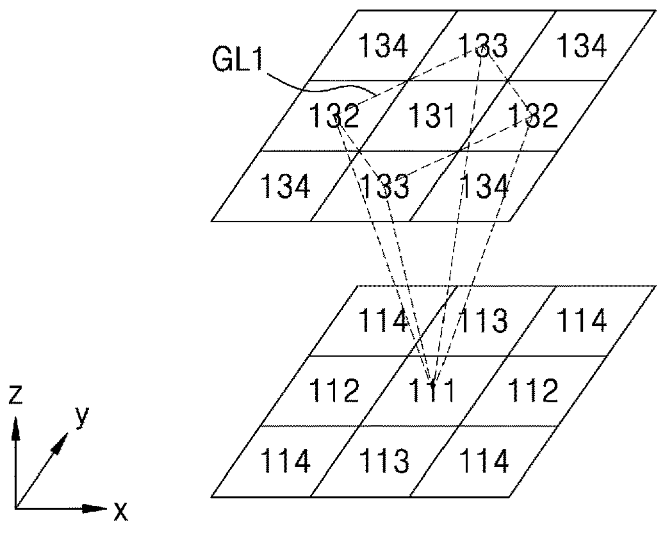
FIG. 6D is a diagram of a traveling direction of green light incident on a first green light concentration region, according to an embodiment.
Figure 6E:
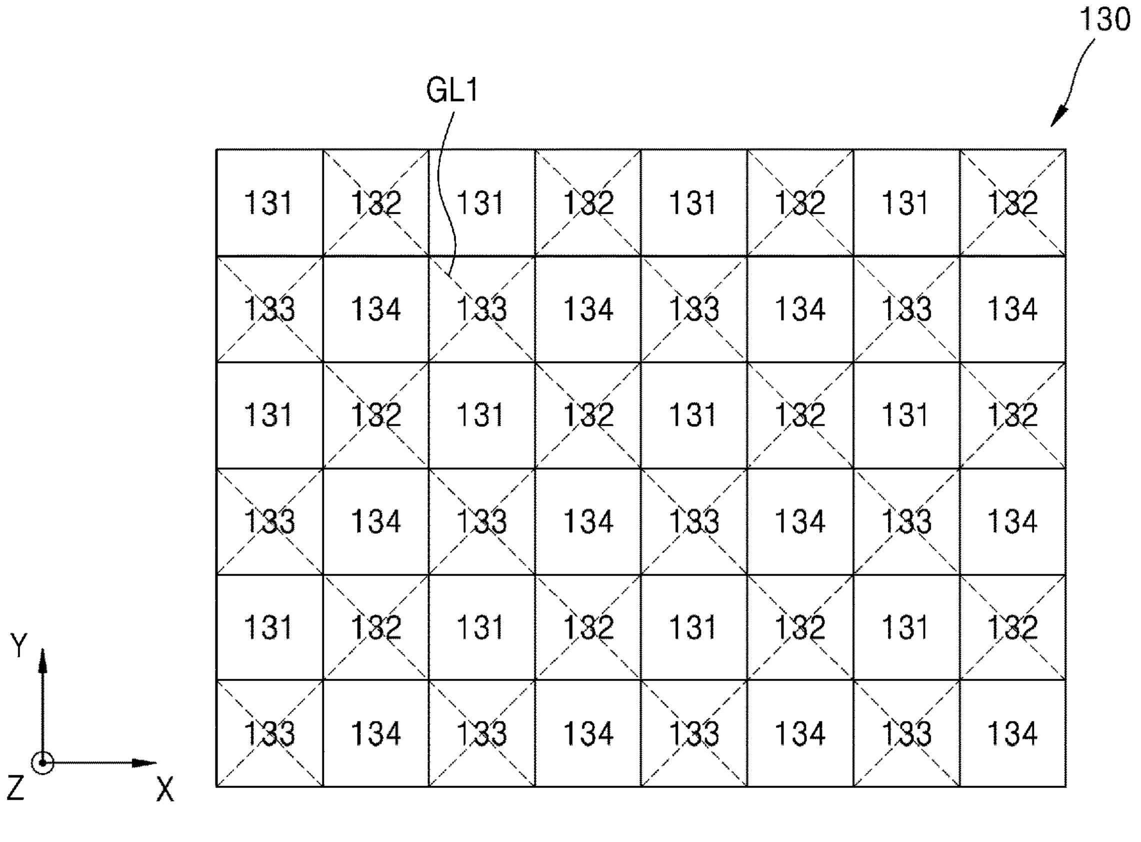
FIG. 6E is a diagram of an array of a first green light concentration region, according to an embodiment.

FIG. 6D is a diagram of a traveling direction of green light incident on a first green light concentration region, and FIG. 6E is a diagram of an array of first green light concentration regions.

As illustrated in FIG. 6D, green light incident around the first green pixel corresponding region 131 concentrates on the first green pixel 111 by the color separation lens array 130, and in addition to the first green pixel corresponding region 131, green light from the blue and red pixel corresponding regions 132 and 133 is incident on the first green pixel 111. For example, in the phase profile of green light described with reference to FIGS. 6A and 6B, green light passing through a first green light concentration region GL1 concentrates on the first green pixel 111, a first green light concentration region GL1 connecting the centers of two adjacent blue pixel corresponding regions 132 and two adjacent red pixel corresponding regions 133, each of which is in contact with each side of the first green pixel corresponding region 131. Accordingly, as illustrated in FIG. 6E, the color separation lens array 130 may operate as an array of first green light concentration regions GL1 that concentrates green light on the first green pixel 111. The first green light concentration region GL1 may have an area greater than that of a corresponding first green pixel 111 and may be, for example, about 1.2 times to about 2 times greater than the corresponding first green pixel 111.

Figure 6F:
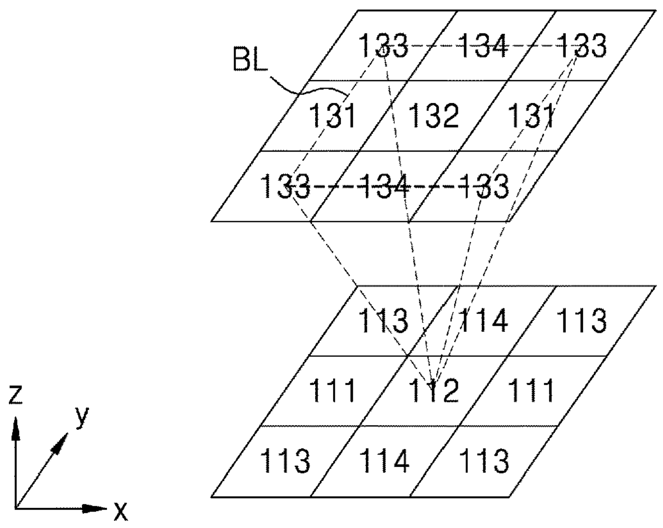
FIG. 6F is a diagram of a traveling direction of blue light incident on a blue light concentration region, according to an embodiment.
Figure 6G:
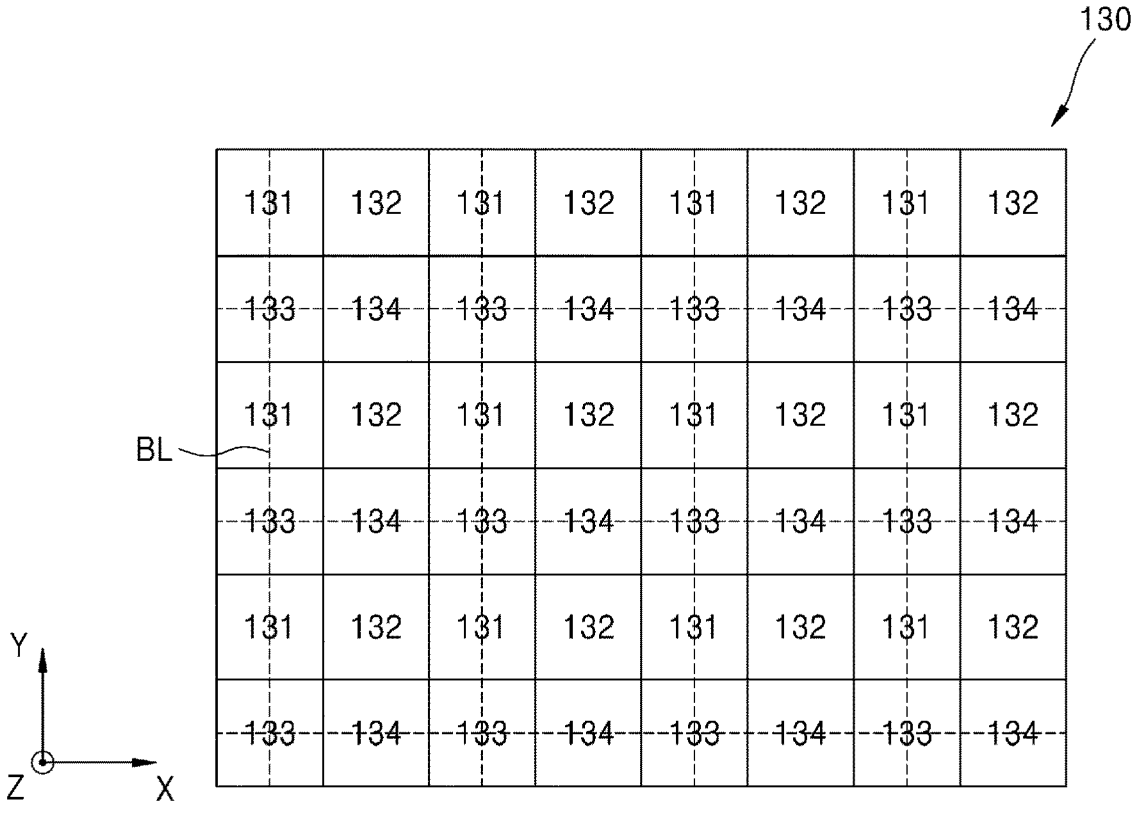
FIG. 6G is a diagram of an array of a blue light concentration region, according to an embodiment.

FIG. 6F is a diagram of a traveling direction of blue light incident on a blue light concentration region, and FIG. 6G is a diagram of an array of blue light concentration regions.

As illustrated in FIG. 6F, blue light concentrates on the blue pixel 112 by the color separation lens array 130, and blue light from the pixel corresponding regions 131, 132, 133, and 134 is incident on the blue pixel 112. The phase profile of blue light described above with reference to FIGS. 6A and 6C concentrates blue light passing through a blue light concentration region BL on the blue pixel 112, the blue light concentration region BL being generated by connecting the centers of four adjacent red pixel corresponding regions 133, each of which is in contact with each vertex of the blue pixel corresponding region 132. Accordingly, as illustrated in FIG. 6G, the color separation lens array 130 may operate as an array of blue light concentration regions BL that concentrates blue light on the blue pixel 112. The blue light concentration region BL may have an area greater than that of a corresponding blue pixel 112 and may be, for example, about 1.5 times to about 4 times greater than the corresponding blue pixel 112. The blue light concentration region BL may partially overlap the aforementioned first green light concentration region GL1 and a second green light concentration region GL2, and a red light concentration region RL, an example of which will be described below.

Figure 7A:
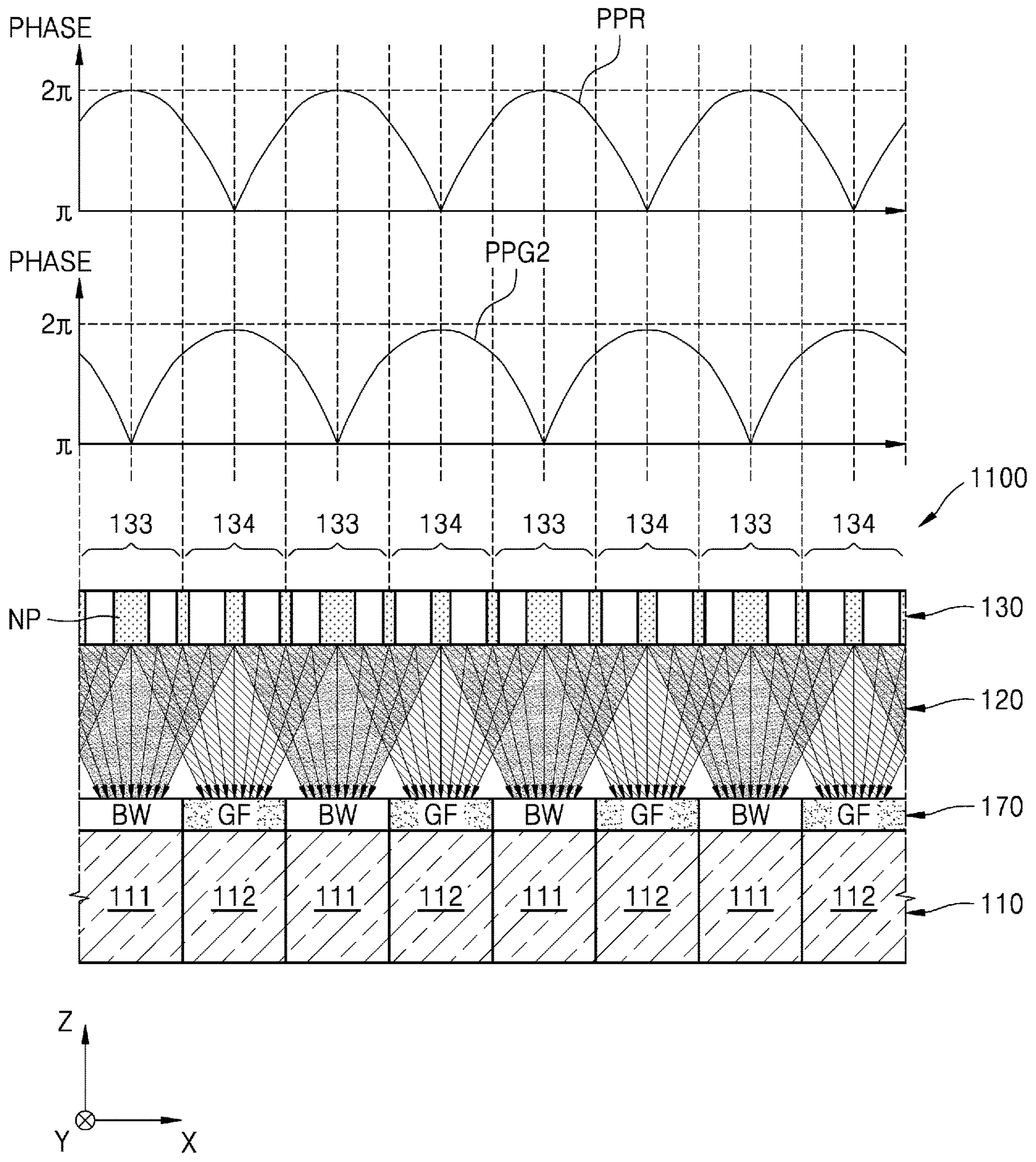
FIG. 7A is a diagram of phase profiles of red light and green light passing through a color separation lens array, taken along a line II-II' of FIG. 5B, according to an embodiment.
Figure 7B:
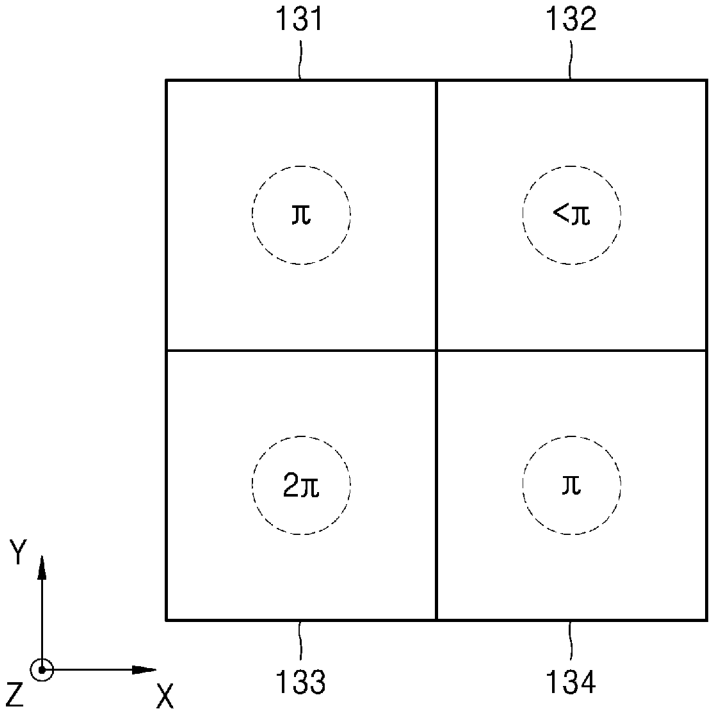
FIG. 7B is a diagram of phases of red light passing through a color separation lens array, at the centers of pixel corresponding regions, according to an embodiment.
Figure 7C:
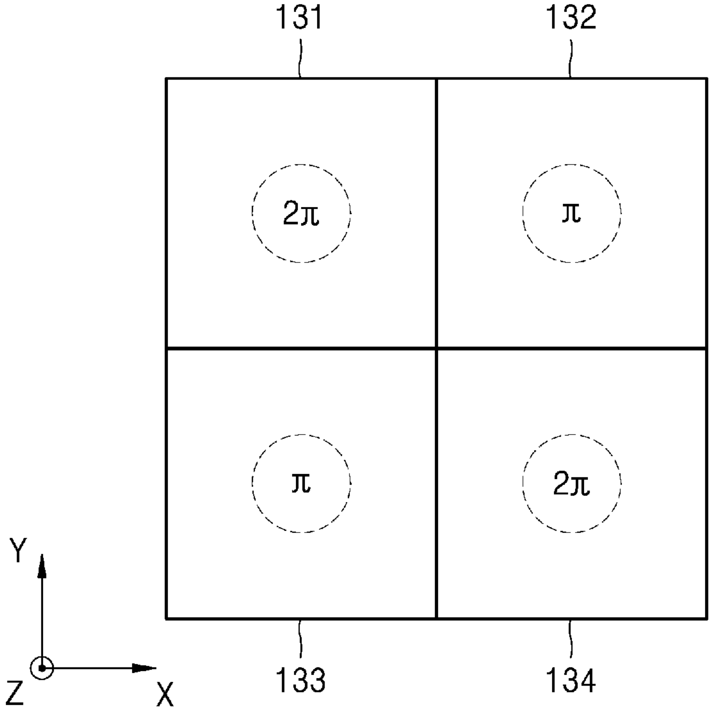
FIG. 7C is a diagram of phases of green light passing through a color separation lens array, at the centers of pixel corresponding regions, according to an embodiment.

FIG. 7A is a diagram of phase profiles of red light and green light passing through the color separation lens array 130, taken along a line II-II' of FIG. 5B, FIG. 7B is a diagram of phases of red light passing through the color separation lens array 130, at the centers of pixel corresponding regions 131, 132, 133, and 134, and FIG. 7C is a diagram of phases of green light passing through the color separation lens array 130, at the centers of pixel corresponding regions 131, 132, 133, and 134.

Referring to FIGS. 7A and 7B, red light passing through the color separation lens array 130 may have a red light phase profile PPR that is greatest at the center of the red pixel corresponding region 133 and decreases in a direction away from the center of the red pixel corresponding region 133. For example, at a position immediately after passing through the color separation lens array 130, a phase of red light is greatest at the center of the red pixel corresponding region 133 and gradually decreases in the form of a concentric circle away from the center of the red pixel corresponding region 133, and is minimized at the centers of the first and second green pixel corresponding regions 131 and 134 in the X-direction and the Y-direction and minimized at the center of the blue pixel corresponding region 132 in a diagonal direction. When a phase of red light at the center of the red pixel corresponding region 133 is 2 π, phases at the centers of the first and second green pixel corresponding regions 131 and 134 may be, for example, about 0.9 π to about 1.1 π, and a phase at the center of the blue pixel corresponding region 132 may have a value less than values of phases at the centers of the first and second green pixel corresponding regions 131 and 134, for example, about 0.6 π to about 0.9 π.

Referring to FIGS. 7A and 7C, green light passing through the color separation lens array 130 may have a second green light phase profile PPG2 that is greatest at the center of the second green pixel corresponding region 134 and decreases in a direction away from the center of the second green pixel corresponding region 134. Comparing the first green light phase profile PPG1 of FIG. 6A with the second green light phase profile PPG2 of FIG. 7A, the second green light phase profile PPG2 is equivalent to a parallel shift of the first green light phase profile PPG1 by a distance of one pixel pitch in the X-direction and the Y-direction. For example, the first green light phase profile PPG1 has the greatest phase at the center of the first green pixel corresponding region 131, whereas the second green light phase profile PPG2 has the greatest phase at the center of the second green pixel corresponding region 134, separated by a distance of one pixel pitch in the X-direction and the Y-direction from the center of the first green pixel corresponding region 131. The phase profiles in FIGS. 6B and 7C illustrating the phases at the centers of the pixel corresponding regions 131, 132, 133, and 134 may be the same. To describe the phase profile of green light based on the second green pixel corresponding region 134 again, when a phase of green light is set to 2 π based on a phase of light emitted from the center of the second green pixel corresponding region 134, light having a phase of about 0.9 π to about 1.1 π may be emitted from the centers of the blue and red pixel corresponding regions 132 and 133, light having a phase of 2 π may be emitted from the center of the first green pixel corresponding region 131, and light having a phase of about 1.1 π to about 1.5 π may be emitted from the contact point between the first green pixel corresponding region 131 and the second green pixel corresponding region 134.

Figure 7D:
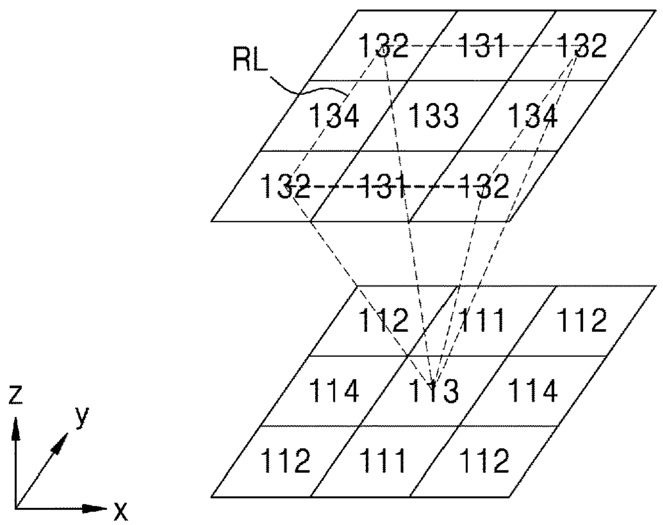
FIG. 7D is a diagram of a traveling direction of red light incident on a red light concentration region, according to an embodiment.
Figure 7E:
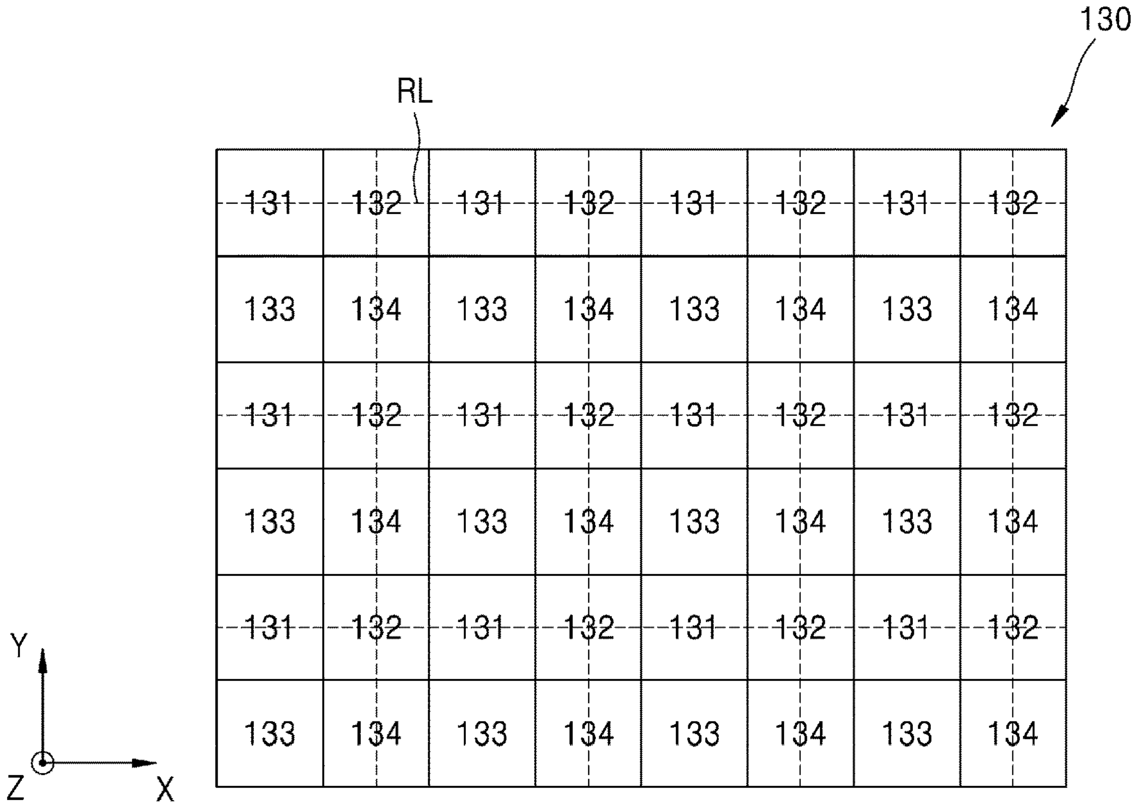
FIG. 7E is a diagram of an array of a red light concentration region, according to an embodiment.

FIG. 7D is a diagram of a traveling direction of red light incident on the red light concentration region, and FIG. 7E is a diagram of an array of red light concentration regions.

As illustrated in FIG. 7D, red light concentrates on the red pixel 113 by the color separation lens array 130, and red light from the pixel corresponding regions 131, 132, 133, and 134 is incident on the red pixel 113. The phase profile of red light described above with reference to FIGS. 7A and 7B concentrates red light passing through a red light concentration region RL on the red pixel 113, the red light concentration region RL being generated by connecting the centers of four adjacent blue pixel corresponding regions 132, each of which is in contact with each vertex of the red light concentration region RL. Accordingly, as illustrated in FIG. 7E, the color separation lens array 130 may operate as an array of red light concentration regions RL that concentrates red light on the red pixel 113. The red light concentration region RL may have an area greater than that of a corresponding red pixel 113 and may be, for example, about 1.5 times to about 4 times greater than the corresponding red pixel 113. The red light concentration region RL may partially overlap the first and second green light concentration regions GL1 and GL2 and the blue light concentration region BL.

Figure 7F:
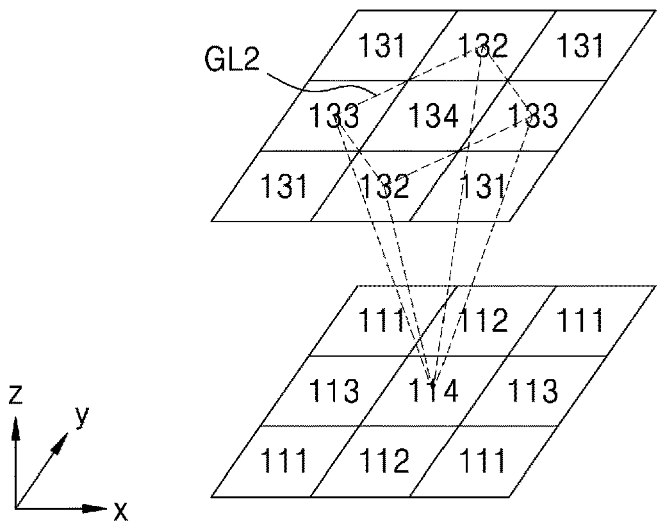
FIG. 7F is a diagram of a traveling direction of green light incident on a second green light concentration region, according to an embodiment.
Figure 7G:
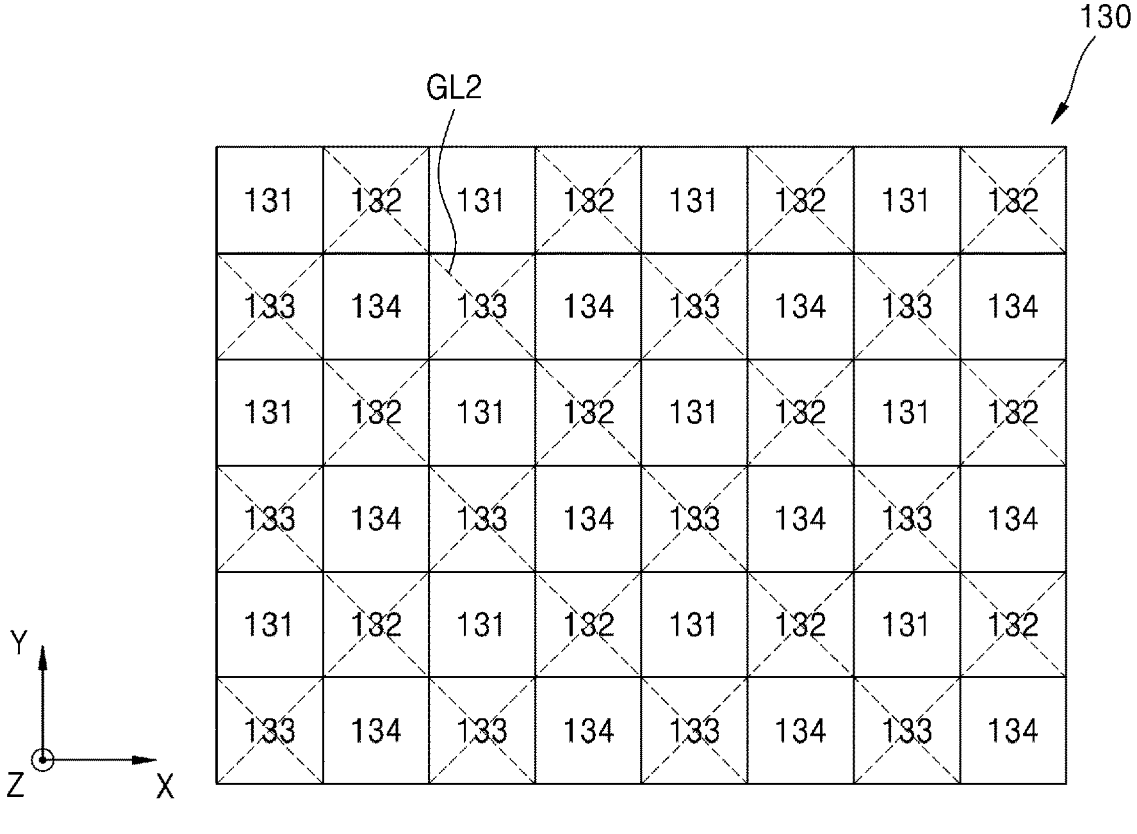
FIG. 7G is a diagram of an array of a second green light concentration region, according to an embodiment.

Referring to FIGS. 7F and 7G, green light incident around the second green pixel corresponding region 134 travels similarly to the aforementioned green light incident around the first green pixel corresponding region 131, and concentrates on the second green pixel 114 as illustrated in FIG. 7F. Accordingly, as illustrated in FIG. 7G, the color separation lens array 130 may operate as an array of second green light concentration regions GL2 that concentrates green light on the second green pixel 114. The second green light concentration region GL2 may have an area greater than that of a corresponding second green pixel 114 and may be, for example, about 1.2 times to about 2 times greater than the corresponding second green pixel 114.

Figure 8A:
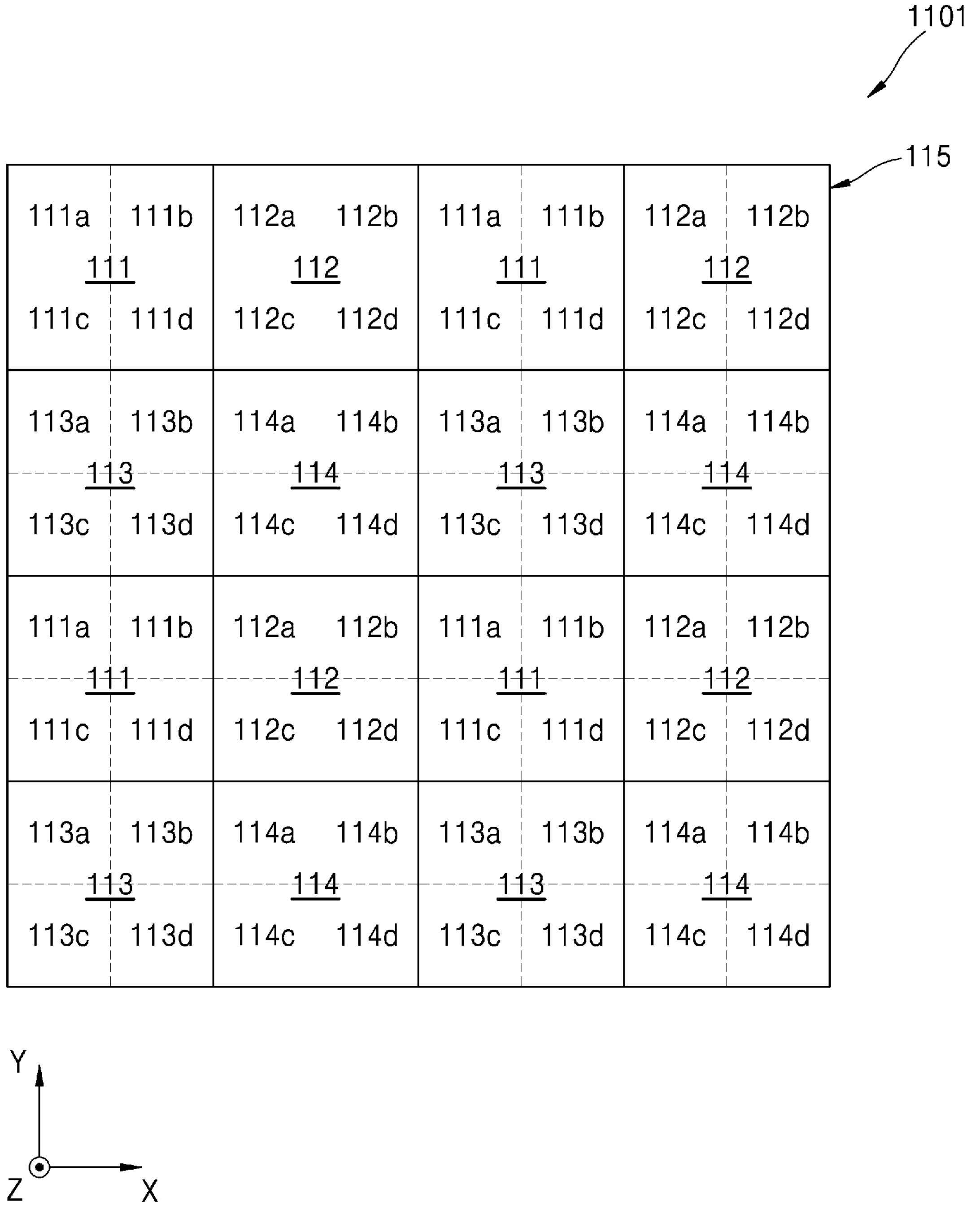
FIGS. 8A and 8B are respectively a plan view and a cross-sectional view of a pixel array of an image sensor, according to another embodiment.
Figure 8B:
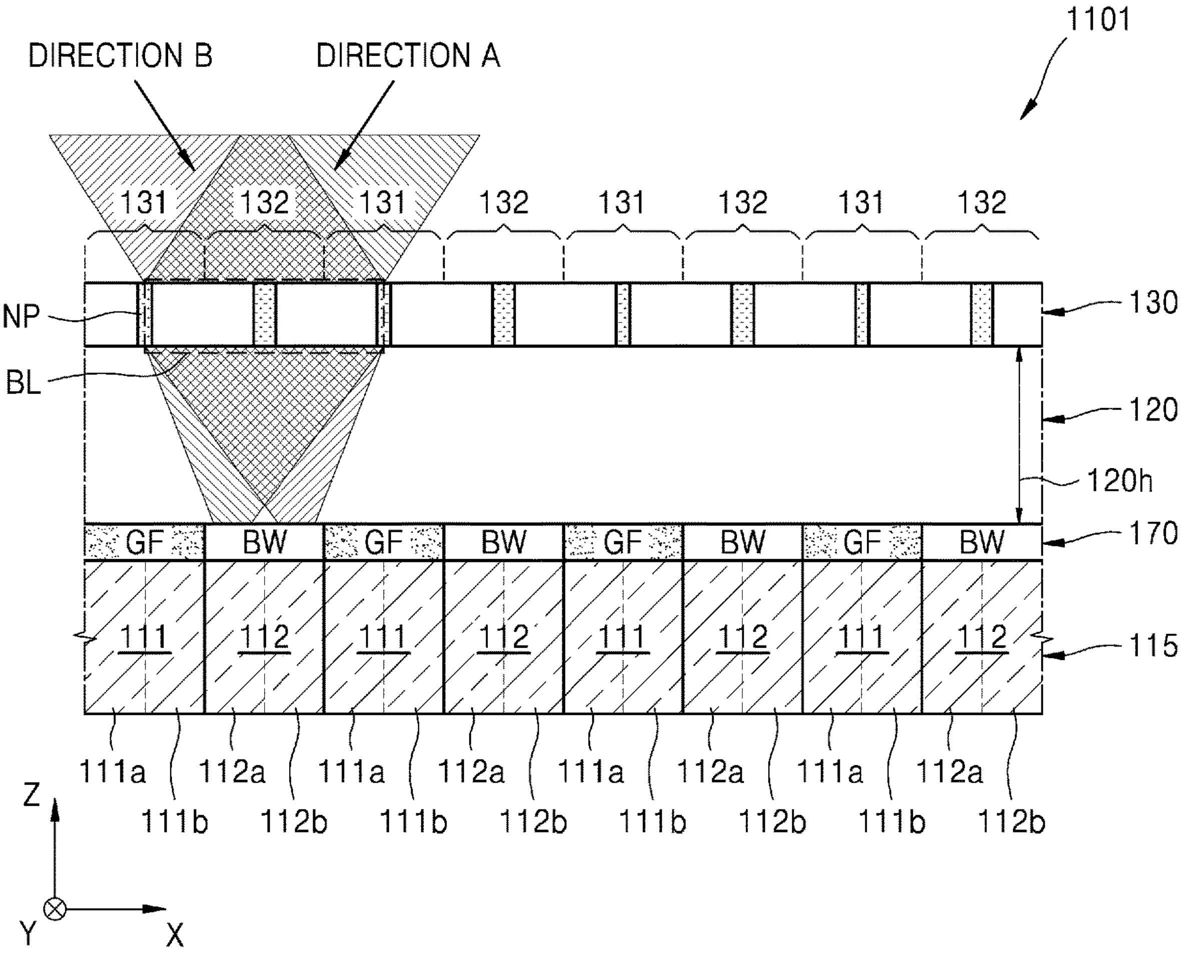

FIG. 8A is a plan view of a pixel array of an image sensor, and FIG. 8B is a cross-sectional view of a pixel array of an image sensor, according to another embodiment.

Referring to FIG. 8A, all or some of the pixels 111, 112, 113, and 114 of a sensor substrate 115 of a pixel array 1101 may include two or more light sensing cells. Four or more light sensing cells included in one pixel may share a light concentration region of a color separation lens array. When one pixel includes a plurality of light sensing cells capable of independently sensing a signal, the resolution of the image sensor 1000 may be improved, and an autofocus function of the image sensor 1000 and/or a camera apparatus including the image sensor 1000 may be implemented by using a difference between signals obtained respectively from the light sensing cells. A pixel including two or more light sensing cells may be an autofocus pixel. FIG. 8A illustrates that each of the pixels 111, 112, 113, and 114 include four light sensing cells. In other words, the first green pixel 111 includes a first-first green light sensing cell 111*a*, a first-second green light sensing cell 111*b*, a first-third green light sensing cell 111*c*, and a first-fourth green light sensing cell 111*d*, the blue pixel 112 includes a first blue light sensing cell 112*a*, a second blue light sensing cell 112*b*, a third blue light sensing cell 112*c*, and a fourth blue light sensing cell 112*d*, the red pixel 113 includes a first red light sensing cell 113*a*, a second red light sensing cell 113*b*, a third red light sensing cell 113*c*, and a fourth red light sensing cell 113*d*, and the second green pixel 114 includes a second-first green light sensing cell 114*a*, a second-second green light sensing cell 114*b*, a second-third green light sensing cell 114*c*, and a second-fourth green light sensing cell 114*d*. However, this is merely an example, and embodiments are not limited thereto. The autofocus pixel may include, for example, 2 to 16 light sensing cells. To accurately calculate a difference between output signals of two or more light sensing cells included in one pixel, the autofocus pixel may include an internal pixel separator for separating the light sensing cells. Because the light sensing cells are separated by the internal pixel separator, a separate signal may be output.

FIG. 8B is a conceptual diagram of obtaining a signal required for focus adjustment by using a pixel including a plurality of light sensing cells sharing a light concentration region. As illustrated in FIG. 8B, among light incident toward the blue light concentration region BL, blue light incident in a direction A may be incident on a first blue light sensing cell 112*a* of the blue pixel 112, and blue light incident in a direction B may be incident on the second light sensing cell 112*b*. For example, a signal sensed by the first light sensing cell 112*a* of the blue pixel 112 may indicate an amount of light incident in the direction A, and a signal sensed by the second light sensing cell 112*b* of the blue pixel 112 may indicate an amount of light incident in the direction B. In this case, a difference between signals sensed by the first and second blue light sensing cells 112*a* and 112*b* may be clearly distinguished according to traveling directions of incident light, and the difference may be used as an autofocus signal. As described above, because the thickness 120*h* of the spacer layer 120 is set based on a focal length generated by a light concentration region of the color separation lens array 130, a difference between signals of light incident in different directions may be clearly distinguished, and an autofocus function may be improved.

Although a pixel arrangement of a Bayer pattern has been illustrated in two aforementioned embodiments, various other types of pixel arrangements are also possible. For example, an RGB-type arrangement in which a red pixel R, a green pixel G, and a blue pixel B may be included in one unit pattern, a CYGM-type arrangement in which a magenta pixel, a cyan pixel, a yellow pixel, and a green pixel may be included in one unit pattern, and a RGBW-type arrangement in which a green pixel G, a red pixel R, a blue pixel B, and a white pixel W may be included in one unit pattern are also possible. Also, the unit pattern may have a 3×2 array type. In addition, pixels of a pixel array may be arranged in various manners according to color characteristics of the image sensor 1000. A color separation lens array and a filter array may be provided in response to various pixel arrangements.

Hereinafter, embodiments of an image sensor including various other types of pixel arrangements and corresponding color separation lens arrays and filter arrays will be described.

Figure 9:
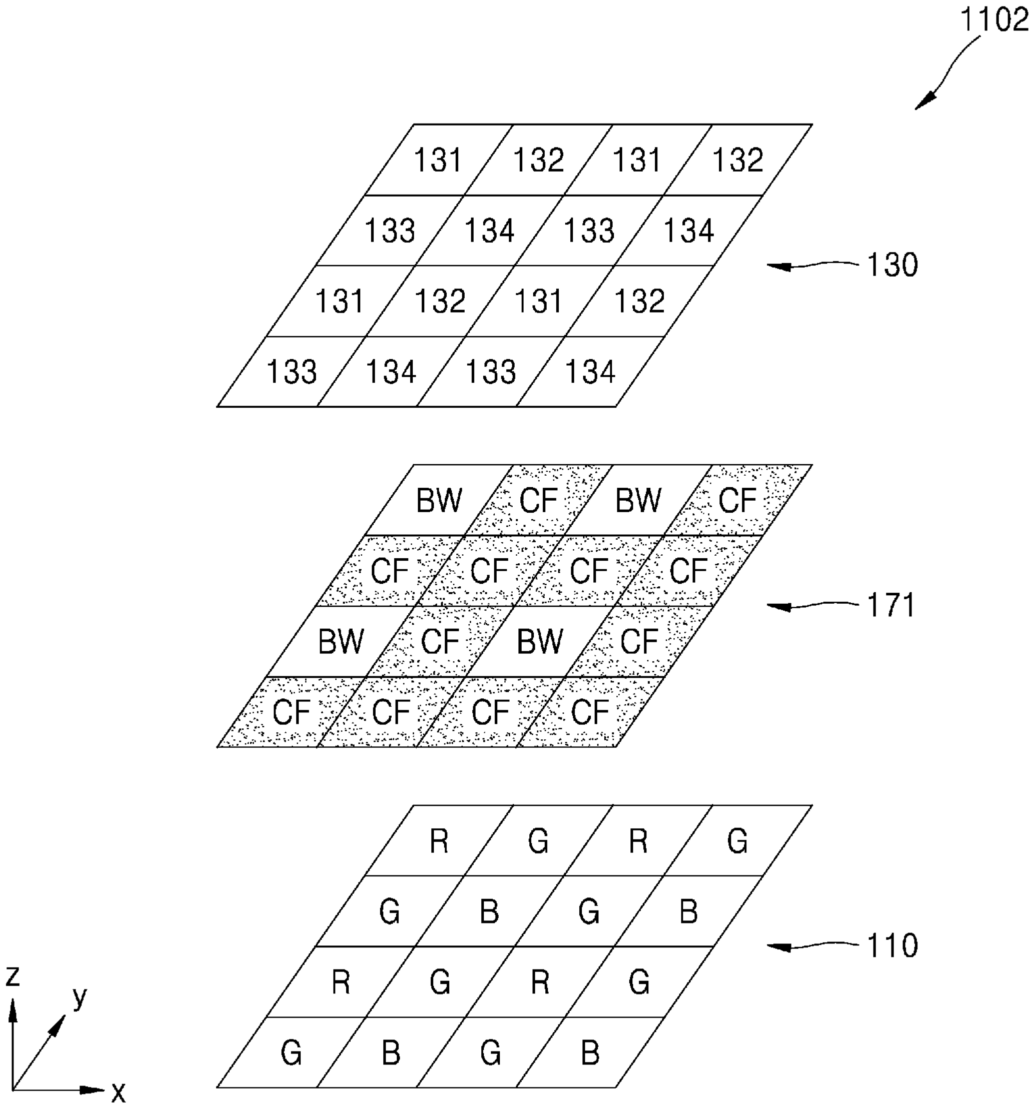
FIG. 9 is a conceptual diagram of a pixel array of an image sensor in a relationship between a pixel arrangement and a corresponding filter array, according to another embodiment.

FIG. 9 is a conceptual diagram of a pixel array of an image sensor in a relationship between a pixel arrangement and a corresponding filter array, according to another embodiment.

A pixel array 1102 of the image sensor includes a sensor substrate 110 having a pixel arrangement of a Bayer pattern, a color separation lens array 130 that separates incident light based on the pixel arrangement of the Bayer pattern, and a filter array 171 positioned between the sensor substrate 110 and the color separation lens array 130. As illustrated in FIG. 9, the pixel array 1102 includes the sensor substrate 110 and the color separation lens array 130, the sensor substrate 110 may be substantially the same as the pixel array 1101 described above, and the filter array 171 may have a filter arrangement that is different from the filter array 170 of the pixel array 1100 described above.

The filter array 171 includes a plurality of cyan filters CF and a plurality of transparent regions BW. The cyan filters CF are arranged to face the green pixels G and the blue pixels B, and the transparent regions BW are arranged to face the red pixels R.

The cyan filters CF are filters that transmit green light and blue light and absorb red light. As described above, crosstalk caused by the color separation lens array 130 may usually occur in a long wavelength band, and red light may be prevented from being incident on the green pixel G or the blue pixel B by using the filter array 171. The cyan filters CF may be manufactured by using a material exhibiting a cyan color, and compared to an existing process of manufacturing a color filter including all of red, green, and blue filter regions, process steps may be reduced to ⅓, and color separation efficiency may be highly improved.

Figure 10:
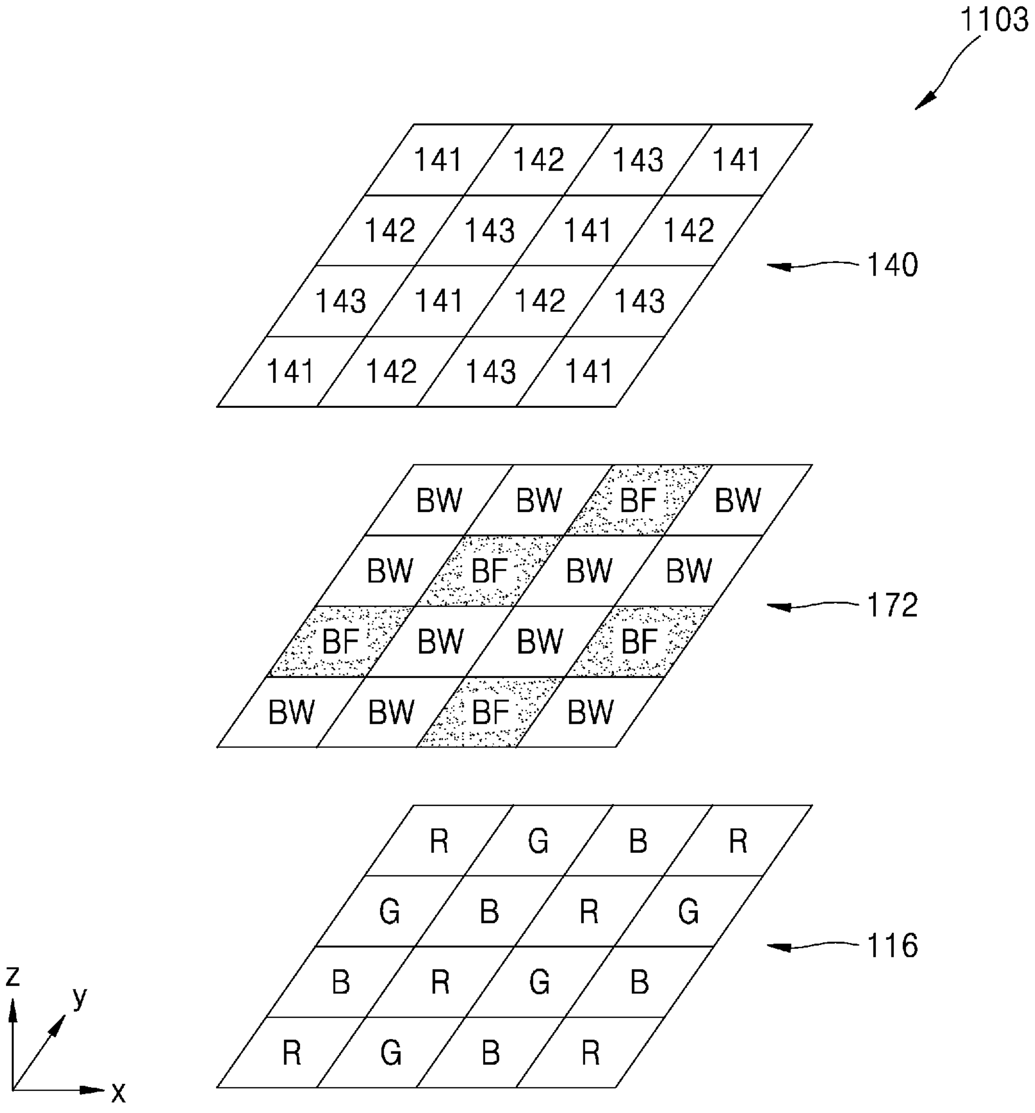
FIG. 10 is a conceptual diagram of a pixel array of an image sensor in a relationship between a pixel arrangement and a corresponding filter array, according to another embodiment.

FIG. 10 is a conceptual diagram of a pixel array of an image sensor in a relationship between a pixel arrangement and a corresponding filter array, according to another embodiment.

In the present embodiment, a pixel array 1103 of the image sensor includes a sensor substrate 116 having an RGB-type pixel arrangement, a color separation lens array 140 including pixel corresponding regions 141, 142, and 143, the color separation lens array 140 separating incident light based on the RGB-type pixel arrangement, and a filter array 172 positioned between the sensor substrate 116 and the color separation lens array 140. The filter array 172 includes a plurality of blue filters BF and a plurality of transparent regions BW, and the blue filters BF are arranged to face the blue pixels B and the transparent regions BW are arranged to face the red pixels R and the green pixels G.

Figure 11:
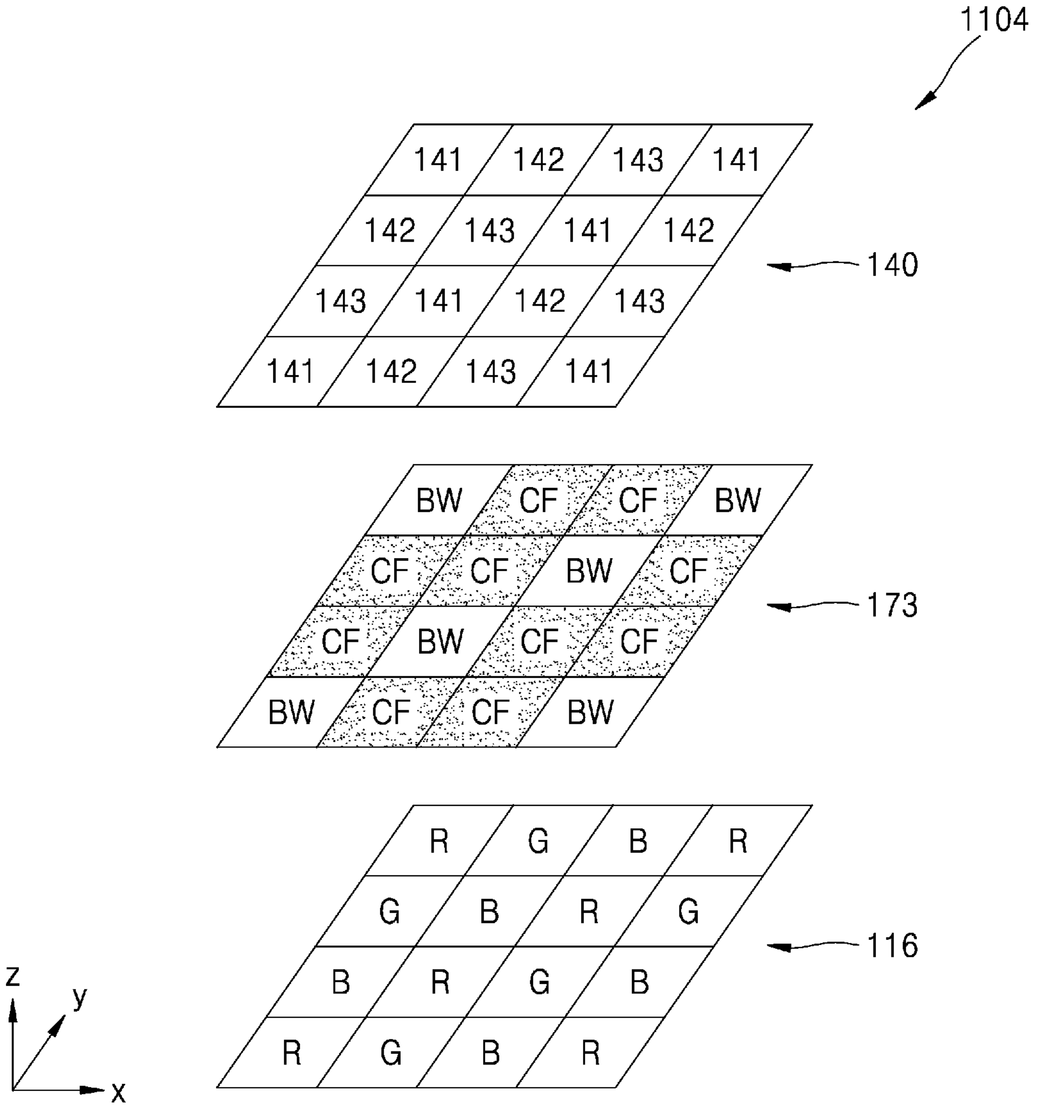
FIG. 11 is a conceptual diagram of a pixel array of an image sensor in a relationship between a pixel arrangement and a corresponding filter array, according to another embodiment.

FIG. 11 is a conceptual diagram of a pixel array of an image sensor in a relationship between a pixel arrangement and a corresponding filter array, according to another embodiment.

In the present embodiment, a pixel array 1104 of the image sensor includes a sensor substrate 116 having an RGB-type pixel arrangement, a color separation lens array 140 including pixel corresponding regions 141, 142, and 143, the color separation lens array 140 separating incident light based on the RGB-type pixel arrangement, and a filter array 173 positioned between the sensor substrate 116 and the color separation lens array 140. The filter array 173 includes a plurality of cyan filters CF and a plurality of transparent regions BW. The cyan filters CF are arranged to face the blue pixels B and the green pixels G, and the transparent regions BW are arranged to face the red pixels R.

Figure 12:
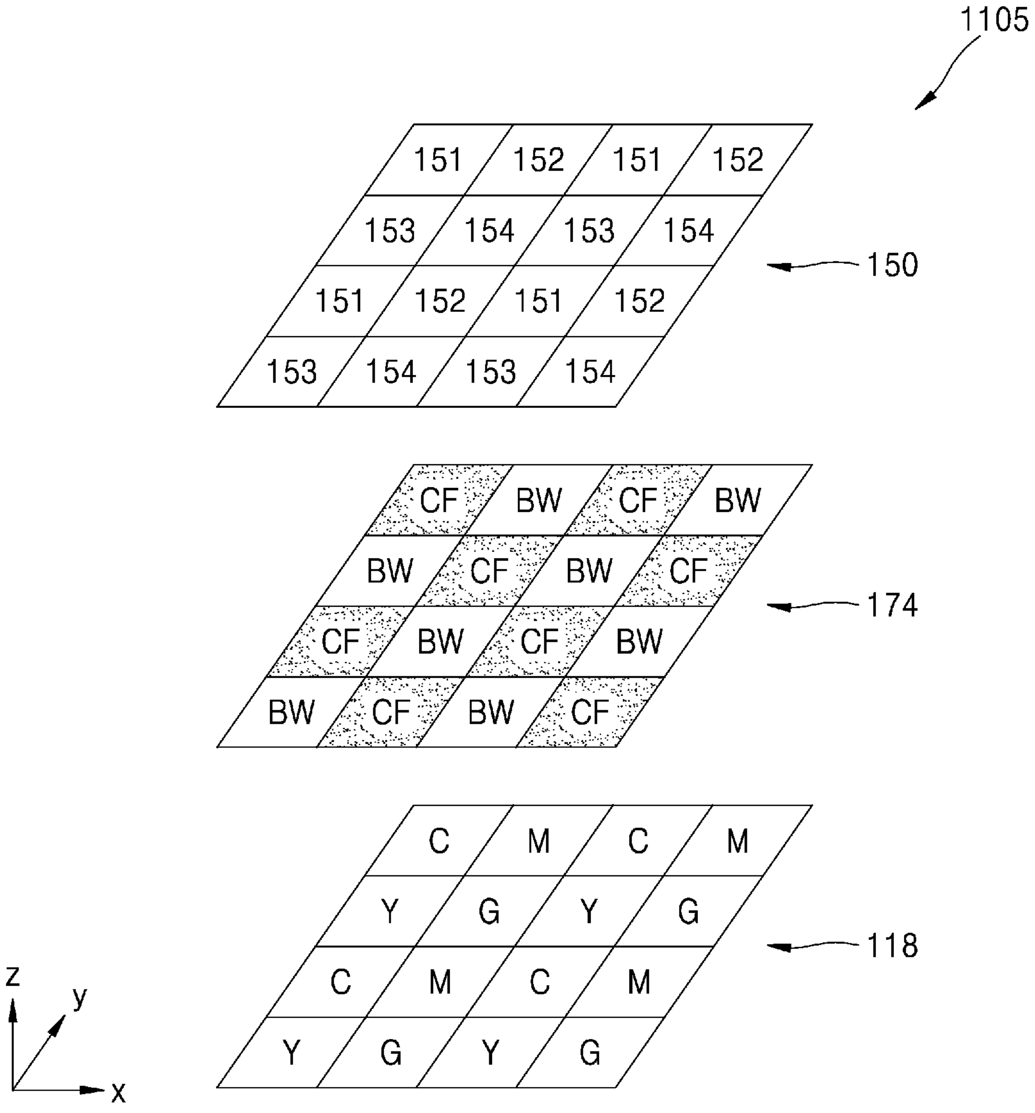
FIG. 12 is a conceptual diagram of a pixel array of an image sensor in a relationship between a pixel arrangement and a corresponding filter array, according to another embodiment.

FIG. 12 is a conceptual diagram of a pixel array of an image sensor in a relationship between a pixel arrangement and a corresponding filter array, according to another embodiment.

In the present embodiment, a pixel array 1105 of the image sensor includes a sensor substrate 118 having a CMYG-type pixel arrangement, a color separation lens array 150 including pixel corresponding regions 151, 152, 153, and 154, the color separation lens array 150 separating incident light based on the CMYG-type pixel arrangement, and a filter array 173 positioned between the sensor substrate 118 and the color separation lens array 150. The sensor substrate 118 include cyan pixels C, magenta pixels M, yellow pixels Y, and green pixels G. The filter array 173 includes cyan filters CF and transparent regions BW. The cyan filters CF are arranged to face the cyan pixels C and the green pixels G, and the transparent regions BW are arranged to face the magenta pixels M and the yellow pixels Y.

The autofocus pixel described with reference to FIGS. 8A and 8B may be applied to the pixel arrays described with reference to FIGS. 9 to 12. For example, some or all of pixels may include a plurality light sensing cells, and a signal difference in the plurality of light sensing cells included in the same pixel may be utilized as an autofocus signal.

Figure 13A:
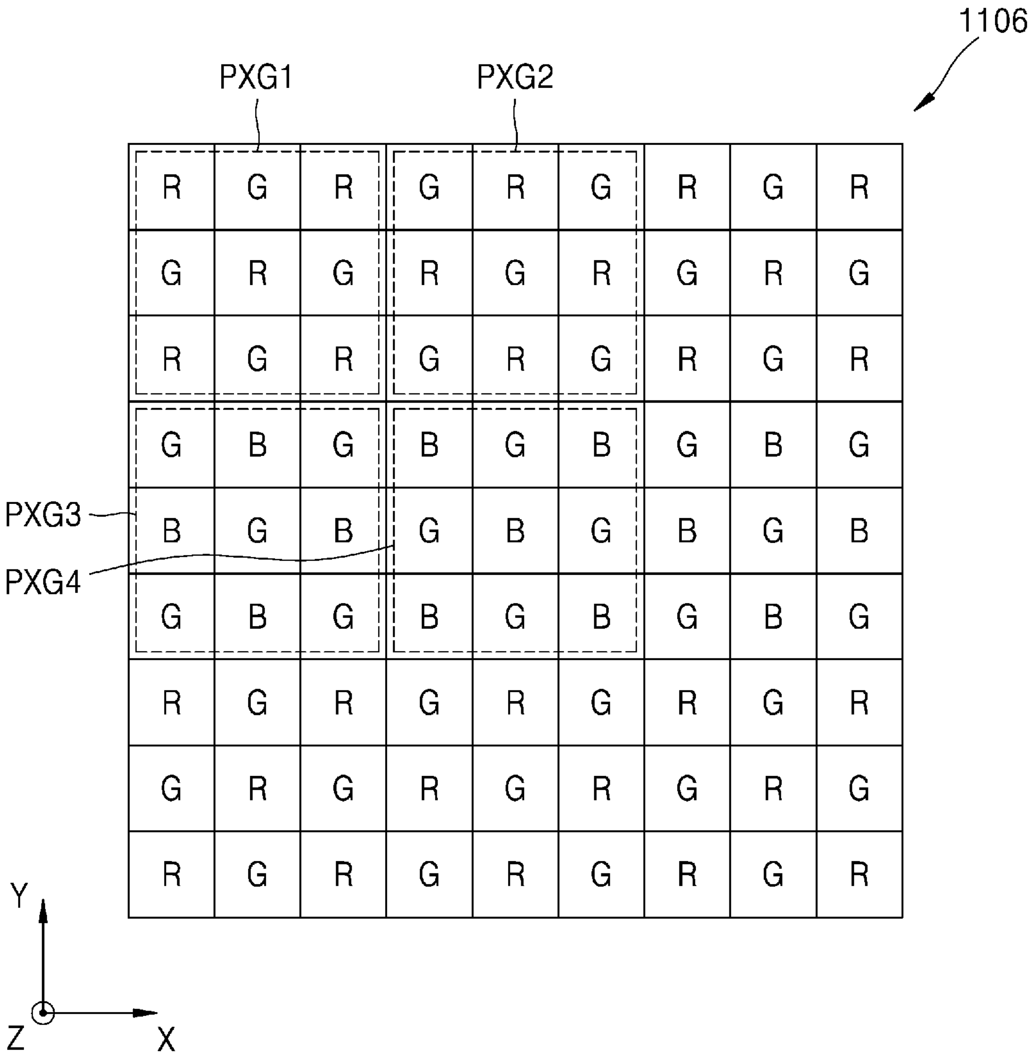
FIGS. 13A to 13C are plan views of a pixel arrangement of a pixel array of an image sensor, a corresponding color separation lens array, and a corresponding filter array, according to another embodiment.
Figure 13B:
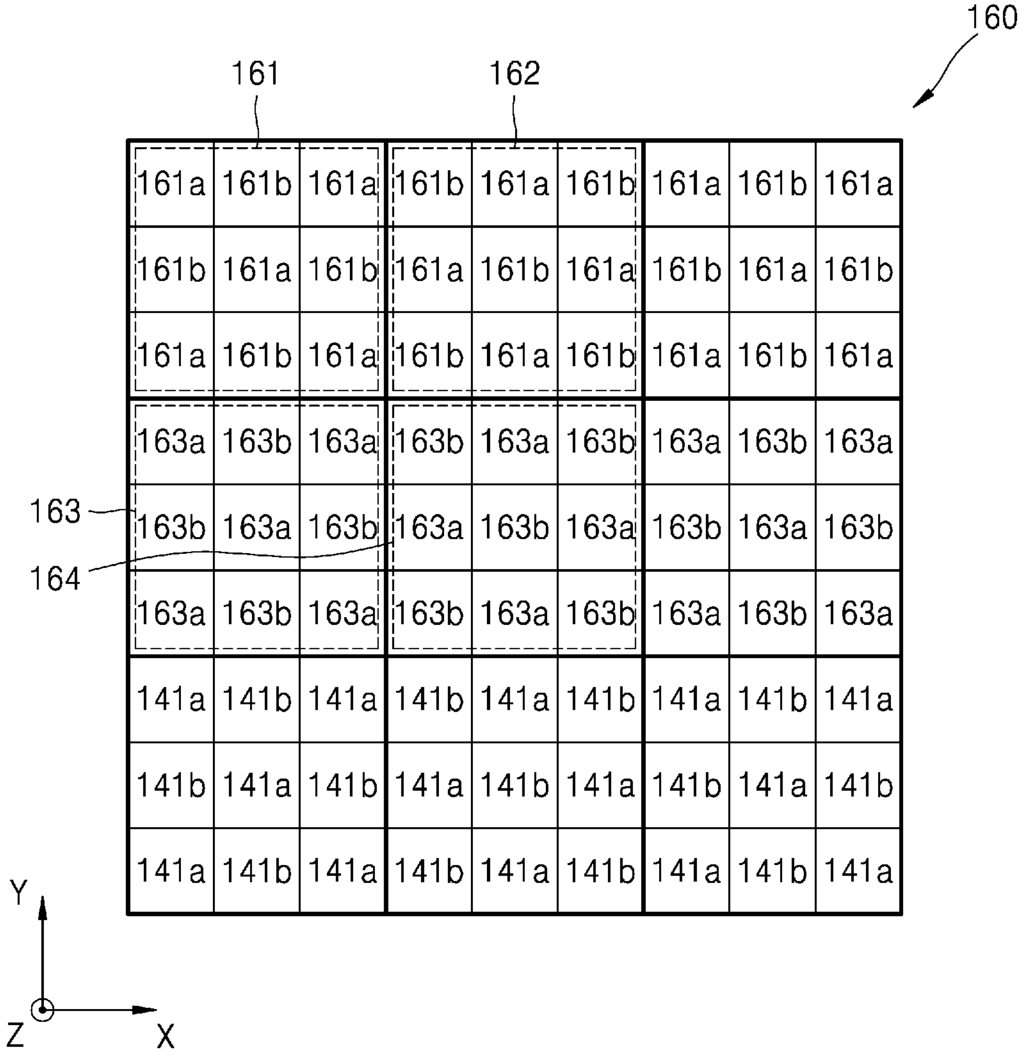
Figure 13C:
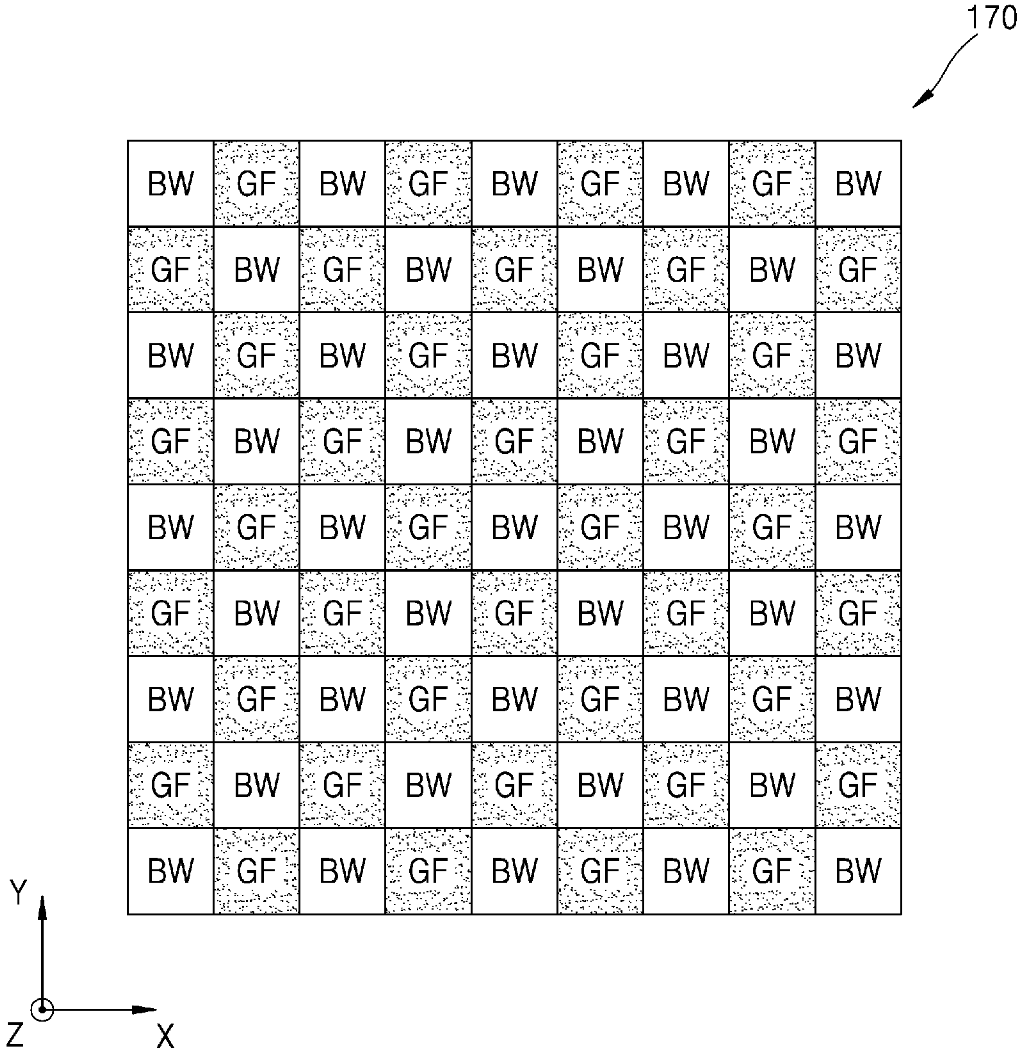

FIGS. 13A to 13C are plan views of a pixel arrangement of a pixel array of an image sensor, a corresponding color separation lens array, and a corresponding filter array, according to another embodiment.

In the present embodiment, a pixel array 1106 has a pixel arrangement capable of representing a Bayer pattern form by pixel binning by using the filter array 170 of a single color.

Pixel binning may refer to, under certain circumstances, a pixel driving scheme in which signals generated from a plurality of pixels are summed into a single signal. The driving may be used, for example, when the resolution of an output image of a camera using an image sensor is lower than the resolution of the image sensor, or to increase the sensitivity when an image is obtained at a low lighting level.

As illustrated in FIG. 13A, a plurality of pixels provided in the pixel array 1106 include a first pixel group PXG1 and a second pixel group PXG2, in which red pixels R are alternately arranged with green pixels G, and a third pixel group PXG3 and a fourth pixel group PXG4, in which green pixels G are alternately arranged with blue pixels B. The first pixel group PXG1 are alternately and repeatedly arranged with the second pixel group PXG2 in an X-direction, and arrangements of the red pixels R and the green pixels Gin the first pixel group PXG1 and the second pixel group PXG2 are set so that, in the first pixel group PXG1 and the second pixel group PXG2 overall, the red pixels R alternate with the green pixels G in the X-direction and a Y-direction. The third pixel group PXG3 are alternately and repeatedly arranged with the fourth pixel group PXG4 in the X-direction in a next row. Arrangements of the green pixels G and the blue pixels B in the third pixel group PXG3 and the fourth pixel group PXG4 are set so that, in the third pixel group PXG3 and the fourth pixel group PXG4 overall, the green pixels G alternate with the blue pixels B in the X-direction and the Y-direction. The first to fourth pixel groups PXG1, PXG2, PXG3, and PXG4 may be included in a unit group, and a plurality of unit groups are two-dimensionally and repeatedly arranged.

As illustrated in FIG. 13B, a color separation lens array 160 is also partitioned into regions corresponding to the pixel arrangement. For example, the color separation lens array 160 includes a first pixel corresponding group 161 and a second pixel corresponding group 162, in which red pixel corresponding regions 161*a* alternate with green pixel corresponding regions 161*b*, and a third pixel corresponding group 163 and a fourth pixel corresponding group 164, in which green pixel corresponding regions 163*a* alternate with green pixel corresponding regions 163*b*. The first to fourth pixel corresponding groups 161, 162, 163, and 164 form a unit group and are two-dimensionally and repeatedly arranged.

As illustrated in FIG. 13C, the filter array 170 may be in the form in which green filters GF facing the green pixels G are alternately arranged with transparent regions BW corresponding to the red pixels R and the blue pixels B, and accordingly, the filter array 170 may be substantially the same as the filter array 170 of the pixel array 1100 of the image sensor described with reference to FIGS. 4A, 4B, and 5C.

Figure 14A:
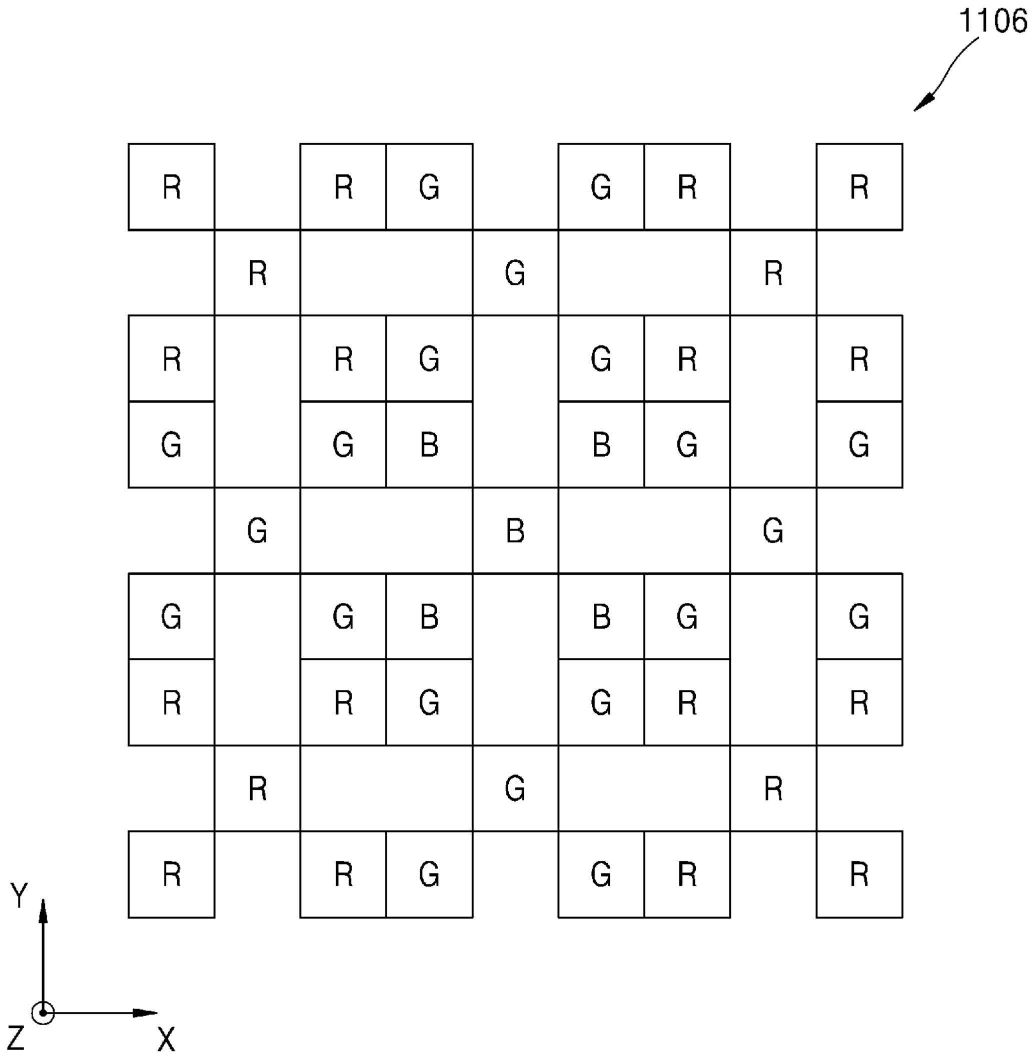
FIGS. 14A and 14B are diagrams of high binning driving and low binning driving of the image sensor of FIGS. 13A to 13C, according to an embodiment.
Figure 14B:
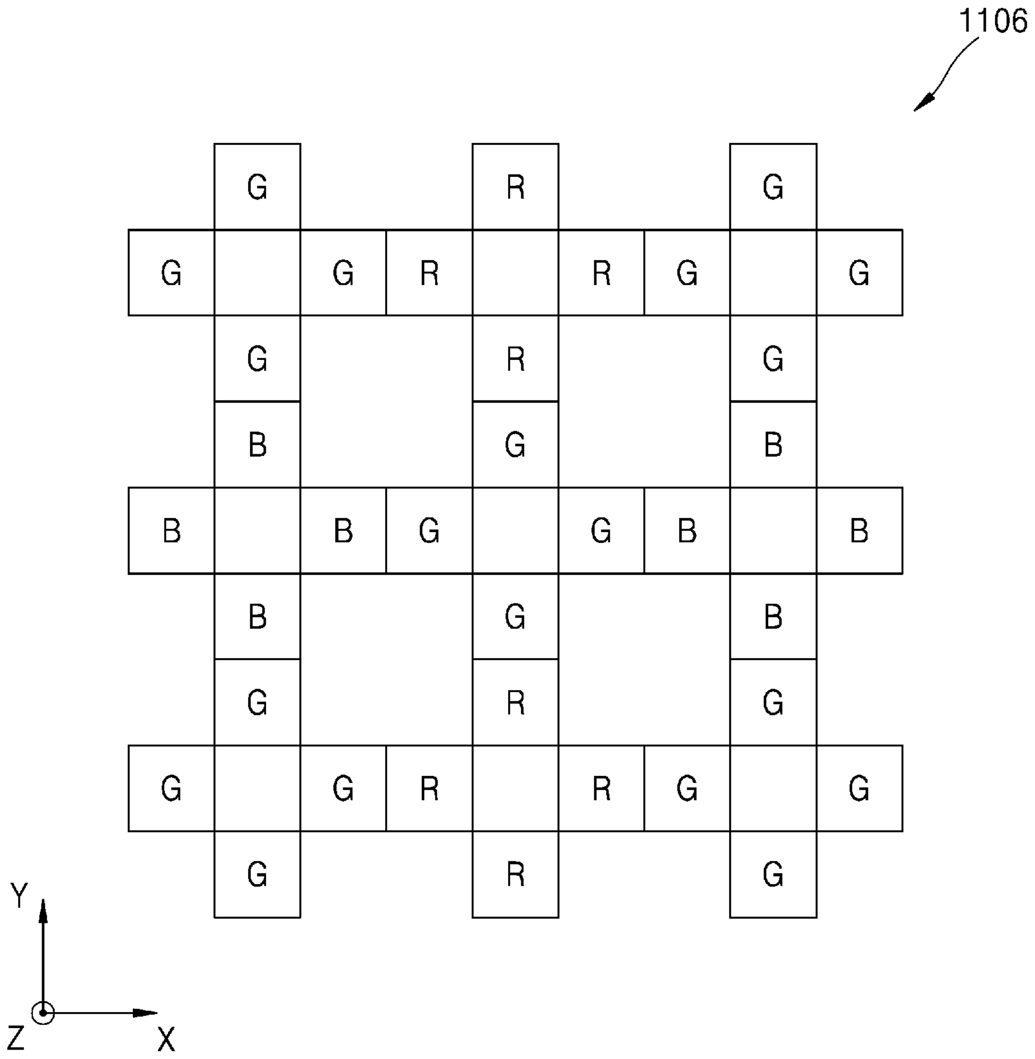

FIGS. 14A and 14B are diagrams of high binning driving and low binning driving of the image sensor of FIGS. 13A to 13C.

Referring to FIG. 14A, signals of pixels adjacent to each other in two diagonal directions in each of the first to fourth pixel groups PXG1, PXG2, PXG3, and PXG4 are summed. Pixels adjacent to each other in an X-direction are combined to represent a color arrangement similar to a Bayer pattern overall.

FIG. 14B illustrates a form in which pixels adjacent to each other in a diamond direction in each of the first to fourth pixel groups PXG1, PXG2, PXG3, and PXG4 are combined. In FIG. 14B, a smaller number of pixels are combined compared to FIG. 14A, and a color arrangement similar to a Bayer pattern in a form different from the pattern shown in FIG. 14A may be represented.

In the above description, a binning group having a 3×3 unit is shown as an example, but the binning group may be set in various other forms such as 4×4, 5×5, etc., and pixels combinations in various forms are possible.

Because the image sensor 1000, including the pixel arrays 1100, 1101, 1102, 1103, 1104, 1105, and 1106 described above, separates colors by using a color separation lens array, there is almost no light loss that occurs when colors are expressed by using an existing color filter, for example, an organic filter, and thus, a sufficient amount of light may be provided to pixels even though sizes of the pixels are reduced. Also, a filter array of a single color having a structure capable of reducing crosstalk of light in a long wavelength band, which may be caused by the color separation lens array, is provided, and accordingly, color separation efficiency may be further improved. Therefore, an ultra-high-resolution, ultra-small, and high-sensitivity image sensor having hundreds of millions of pixels or more may be manufactured. The ultra-high-resolution, ultra-small, and high-sensitivity image sensor may be used in various high-performance optical apparatuses or high-performance electronic apparatuses.

Figure 15:
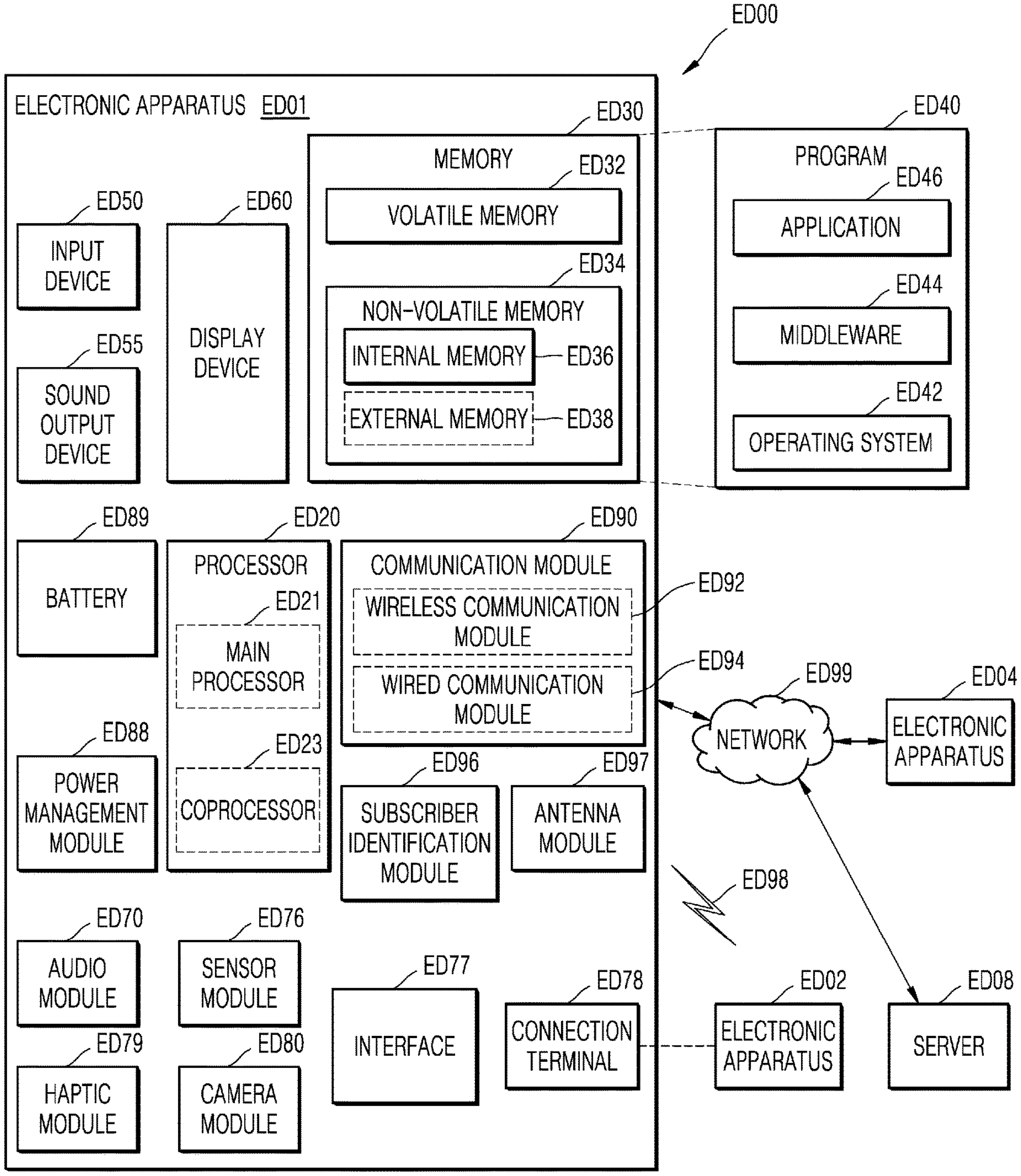
FIG. 15 is a schematic block diagram of an electronic apparatus including an image sensor, according to an embodiment.

FIG. 15 is a block diagram illustrating an example of an electronic apparatus ED01 including the image sensor 1000. Referring to FIG. 15, in a network environment ED00, the electronic apparatus ED01 may communicate with another electronic apparatus ED02 through a first network ED98 (e.g., a short-range wireless communication network, etc.) or communicate with another electronic apparatus ED04 and/or a server ED08 through a second network ED99 (e.g., a long-distance wireless communication network, etc.). The electronic apparatus ED01 may communicate with the electronic apparatus ED04 through the server ED08. The electronic apparatus ED01 may include a processor ED20, a memory ED30, an input device ED50, a sound output device ED55, a display device ED60, an audio module ED70, a sensor module ED76, an interface ED77, a haptic module ED79, a camera module ED80, a power management module ED88, a battery module ED89, a communication module ED90, a subscriber identification module ED96, and/or an antenna module ED97. In the electronic apparatus ED01, some components (e.g., the display device ED60, etc.) of these components may be omitted or another component may be added. Some components of these components may be implemented as one integrated circuit. For example, the sensor module ED76 (e.g., a fingerprint sensor, an iris sensor, an illuminance sensor, etc.) may be embedded and implemented in the display device ED60 (e.g., a display, etc.).

The processor ED20 may execute software (e.g., a program ED40, etc.) to control one or a plurality of other components (e.g., hardware and software components, etc.) of the electronic apparatus ED01 connected to the processor ED20 or to perform various data processing or calculations. As a part of data processing or calculations, the processor ED20 may load commands and/or data received from another component (e.g., the sensor module ED76, the communication module ED90, etc.) into a volatile memory ED32, process the commands and/or data stored in the volatile memory ED32, and store result data in a non-volatile memory ED34. The processor ED20 may include a main processor ED21 (e.g., a central processing unit, an application processor, etc.) and a coprocessor ED23 (e.g., a graphics processing unit, an image signal processor, a sensor hub processor, a communication processor, etc.) that may operate independently or together with the main processor ED21. The coprocessor ED23 may use less power than the main processor ED21 and may perform a specialized function.

The coprocessor ED23 may control functions and/or states related to some components (e.g., the display device ED60, the sensor module ED76, the communication module ED90, etc.) of the electronic apparatus ED01, on behalf of the main processor ED21 while the main processor ED21 is in an active state (a sleep state) or together with the main processor ED21 while the main processor ED21 is in an active state (an application execution state). The coprocessor ED23 (e.g., an image processor, a communication processor, etc.) may be implemented as a part of another functionally-related component (e.g., the camera module ED80, the communication module ED90, etc.).

The memory ED30 may store various data required by a component (e.g., the processor ED20, the sensor module ED76, etc.) of the electronic apparatus ED01. Data may include, for example, input data and/or output data for software (e.g., the program ED40, etc.) and commands related to the software. The memory ED30 may include the volatile memory ED32 and/or the non-volatile memory ED34.

The program ED40 may be stored as software in the memory ED30 and may include an operating system ED42, middleware ED44, and/or an application ED46.

The input device ED50 may receive, from an external source (e.g., a user, etc.) of the electronic apparatus ED01, commands and/or data to be used for a component (e.g., the processor ED20, etc.) of the electronic apparatus ED01. The input device ED50 may include a microphone, a mouse, a keyboard, and/or a digital pen (a stylus pen, etc.).

The sound output device ED55 may output a sound signal to an outside of the electronic apparatus ED01. The sound output device ED55 may include a speaker and/or a receiver. The speaker may be used for general purposes, such as multimedia playback or recording playback, and the receiver may be used to receive incoming calls. The receiver may be integrated as a part of the speaker or may be implemented as a separate independent device.

The display device ED60 may visually provide information to the outside of the electronic apparatus ED01. The display device ED60 may include a display, a hologram device, or a projector and a control circuit for controlling a corresponding device. The display device ED60 may include a touch circuitry configured to sense a touch and/or a sensor circuit (e.g., a pressure sensor, etc.) configured to measure the intensity of a force generated by a touch.

The audio module ED70 may convert a sound into an electrical signal or, conversely, convert an electrical signal into a sound. The audio module ED70 may obtain a sound through the input device ED50 or output a sound through a speaker and/or a headphone of the sound output device ED55 and/or another electronic apparatus (e.g., the electronic apparatus ED02, etc.) directly or wirelessly connected to the electronic apparatus ED01.

The sensor module ED76 may sense an operating state (e.g., power, temperature, etc.) of the electronic apparatus ED01 or an external environmental state (e.g., a user state, etc.) and generate an electrical signal and/or a data value corresponding to the sensed state. The sensor module ED76 may include a gesture sensor, a gyro sensor, a barometric pressure sensor, a magnetic sensor, an acceleration sensor, a grip sensor, a proximity sensor, a color sensor, an IR sensor, a biometric sensor, a temperature sensor, a humidity sensor, and/or an illuminance sensor.

The interface ED77 may support one or a plurality of designated protocols that may be used to directly or wirelessly connect the electronic apparatus ED01 with another electronic apparatus (e.g., the electronic apparatus ED02, etc.). The interface ED77 may include a high definition multimedia interface (HDMI), a universal serial bus (USB) interface, a secure digital (SD) card interface, and/or an audio interface.

A connection terminal ED78 may include a connector through which the electronic apparatus ED01 may be physically connected to another electronic apparatus (e.g., the electronic apparatus ED02). The connection terminal ED78 may include an HDMI connector, a USB connector, an SD card connector, and/or an audio connector (e.g., a headphone connector, etc.).

The haptic module ED79 may convert an electrical signal into a mechanical stimulus (e.g., a vibration, a movement, etc.) or an electrical stimulus that a user may perceive through tactile or kinesthetic sense. The haptic module ED79 may include a motor, a piezoelectric element, and/or an electrical stimulation device.

The camera module ED80 may capture still images and shoot videos. The camera module ED80 may include a lens assembly including one or a plurality of lenses, the image sensor 1000 of FIG. 1, image signal processors, and/or flashes. A lens assembly included in the camera module ED80 may collect light emitted from a subject whose image is to be captured.

The power management module ED88 may manage power supplied to the electronic apparatus ED01. The power management module ED88 may be implemented as a part of a power management integrated circuit (PMIC).

The battery module ED89 may supply power to a component of the electronic apparatus ED01. The battery module ED89 may include a non-rechargeable primary cell, a rechargeable secondary cell, and/or a fuel cell.

The communication module ED90 may support establishment of a direct (wired) communication channel and/or a wireless communication channel between the electronic apparatus ED01 and another electronic apparatus (e.g., the electronic apparatus ED02, the electronic apparatus ED04, the server ED08, etc.) and performance of communication through an established communication channel. The communication module ED90 may include one or a plurality of communication processors that operate independently of the processor ED20 (e.g., an application processor, etc.) and support direct communication and/or wireless communication. The communication module ED90 may include a wireless communication module ED92 (e.g., a cellular communication module, a short-range wireless communication module, a global navigation satellite system (GNSS), etc.) and/or a wired communication module ED94 (e.g., a local area network (LAN) communication module, a power line communication module, etc.). Among these communication modules, a corresponding communication module may communicate with another electronic apparatus through the first network ED98 (e.g., a short-range communication network such as Bluetooth, Wi-Fi direct, or infrared data association (IrDA)) or the second network ED99 (e.g., a long-distance communication network such as a cellular network, the Internet, or a computer network (e.g., LAN, wide area network (WAN), etc.). These various types of communication modules may be integrated into one component (e.g., a single chip, etc.) or may be implemented as a plurality of components (e.g., a plurality of chips, etc.) separate from each other. The wireless communication module ED92 may identify and authenticate the electronic apparatus ED01 within a communication network such as the first network ED98 and/or the second network ED99 by using subscriber information (e.g., an international mobile subscriber identity (IMSI), etc.) stored in the subscriber identification module ED96.

The antenna module ED97 may transmit or receive a signal and/or power to or from the outside the electronic apparatus ED01 (e.g., another electronic apparatus, etc.). The antenna may include a radiator having a conductive pattern formed on a substrate (e.g., a printed circuit board (PCB), etc.). The antenna module ED97 may include one or a plurality of antennas. When a plurality of antennas are included, an antenna suitable for a communication method used in a communication network such as the first network ED98 and/or the second network ED99 may be selected from among the plurality of antennas by the communication module ED90. A signal and/or power may be transmitted or received between the communication module ED90 and another electronic apparatus through the selected antenna. In addition to the antenna, other components (e.g., a radio frequency integrated circuit (RFIC), etc.) may be included as a part of the antenna module ED97.

Some of the components are connected to each other and exchange a signal (e.g., a command, data, etc.) by using a communication method (e.g., a bus, a general purpose input and output (GPIO), a serial peripheral interface (SPI), a mobile industry processor interface (MIPI), etc.) between surrounding devices.

The command or data may be transmitted or received between the electronic apparatus ED01 and the electronic apparatus ED04 on the outside through the server ED08 connected to the second network ED99. Other electronic apparatuses ED02 and ED04 may be the same types of apparatuses as or different types of apparatuses from the electronic apparatus ED01. All or some of operations performed in the electronic apparatus ED01 may be executed in one or a plurality of apparatuses among the other electronic apparatuses ED02, ED04, and ED08. For example, when the electronic apparatus ED01 needs to perform a function or service, the electronic apparatus ED01 may request one or a plurality of other electronic apparatuses to perform part or all of the function or service instead of executing the function or service itself. The one or plurality of other electronic apparatuses that have been requested may execute an additional function or service related to the request and transmit a result of the execution to the electronic apparatus ED01. To this end, cloud computing, distributed computing, and/or client-server computing techniques may be used.

Figure 16:
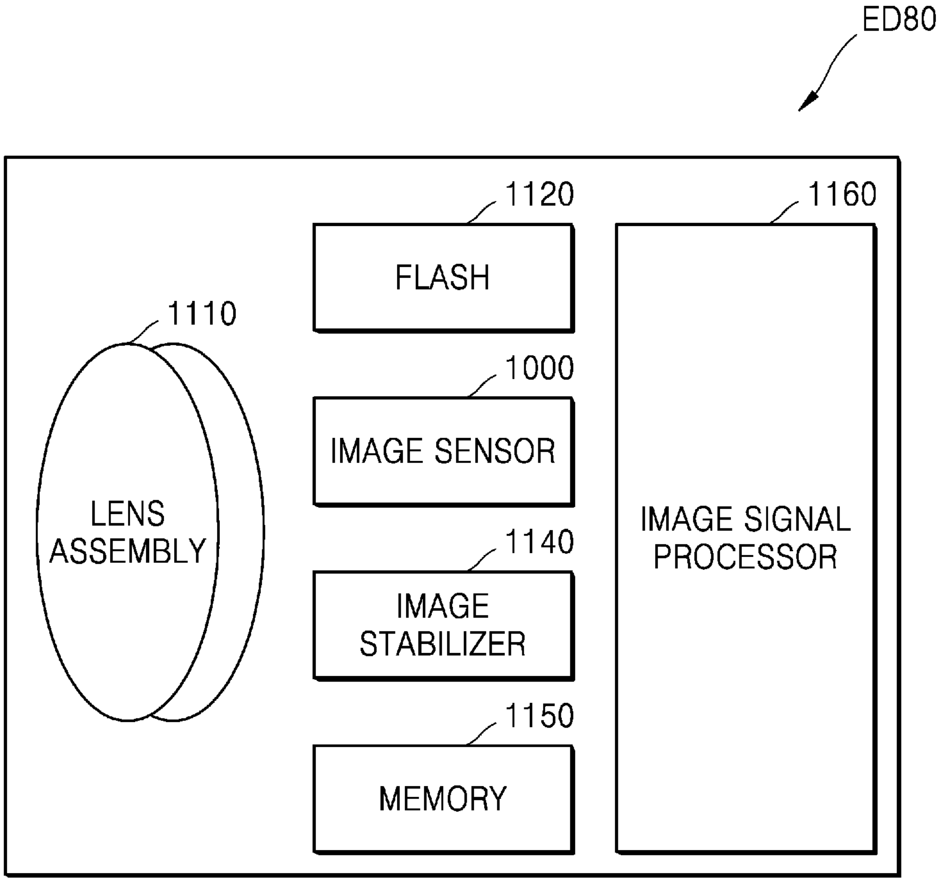
FIG. 16 is a schematic block diagram of a camera module provided in the electronic apparatus of FIG. 15, according to an embodiment.

FIG. 16 is a block diagram of the camera module ED80 provided in the electronic apparatus of FIG. 15. Referring to FIG. 16, the camera module ED80 may include a lens assembly 1110, a flash 1120, an image sensor 1000 (the image sensor 1000 of FIG. 1), an image stabilizer 1140, a memory 1150, (e.g., a buffer memory, etc.), and/or an image signal processor 1160. The lens assembly 1110 may collect light emitted from a subject whose image is to be captured. The camera module ED80 may include a plurality of lens assemblies 1110. In this case, the camera module ED80 may be a dual camera, a 360-degree camera, or a spherical camera. Some of the plurality of lens assemblies 1110 may have the same lens property (e.g., an angle of view, a focal length, autofocus, an F-number, an optical zoom, etc.) or may have different lens properties. The lens assembly 1110 may include a wide-angle lens or a telephoto lens.

The flash 1120 may emit light used to enhance light emitted or reflected from the subject. The flash 1120 may include one or a plurality of light-emitting diodes (LEDs) (e.g., an RGB LED, a white LED, an IR LED, an ultraviolet (UV) LED, etc.) and/or a xenon lamp. The image sensor 1000 may be the image sensor described with reference to FIG. 1, and may include one or more of the pixel arrays 1100, 1101, 1102, 1103, 1104, 1105, and 1106 discussed above. By converting the light emitted or reflected from the subject and transmitted through the lens assembly 1110 into an electrical signal, an image corresponding to the subject may be obtained. The image sensor 1000 may include one or a plurality of sensors selected from among image sensors having different properties, such as an RGB sensor, a black and white (BW) sensor, an IR sensor, or a UV sensor. Each of the sensors included in the image sensor 1000 may be implemented as a CCD sensor and/or a CMOS sensor.

The image stabilizer 1140 may respond to a movement of the camera module ED80 or the electronic apparatus ED01 including the camera module ED80 and move the image sensor 1000 or one or a plurality of lenses included in the lens assembly 1110 in a specific direction or control operation characteristics of the image sensor 1000 (e.g., adjustment of read-out timing, etc.) to compensate for a negative effect of the movement. The image stabilizer 1140 may sense the movement of the camera module ED80 or the electronic apparatus ED01 by using a gyro sensor or an acceleration sensor positioned inside or outside the camera module ED80. The image stabilizer 1140 may be optically implemented.

The memory 1150 may store some or all of image data obtained by using the image sensor 1000 for a next image processing operation. For example, the memory 1150 is used such that, when a plurality of images are obtained at high speed, obtained original data (e.g., Bayer-patterned data, high-resolution data, etc.) is stored in the memory 1150, and only a low-resolution image is displayed, and then, original data of a selected (user-selected, etc.) image is transmitted to the image signal processor 1160. The memory 1150 may be integrated into the memory ED30 of the electronic apparatus ED01 or may be configured as a separate memory operating independently.

The image signal processor 1160 may perform image processing on images obtained by using the image sensor 1000 or image data stored in the memory 1150. The image processing may include depth map generation, three-dimensional modeling, panorama generation, feature point extraction, image synthesis, and/or image compensation (e.g., noise reduction, resolution adjustment, brightness adjustment, blurring, sharpening, softening, etc.). The image signal processor 1160 may perform control (e.g., exposure time control, read-out timing control, etc.) on components (e.g., the image sensor 1000, etc.) included in the camera module ED80. An image processed by the image signal processor 1160 may be stored back in the memory 1150 for further processing or may be provided to an external component (e.g., the memory ED30, the display device ED60, the electronic apparatus ED02, the electronic apparatus ED04, the server ED08, etc.) of the camera module ED80. The image signal processor 1160 may be integrated into the processor ED20 or may be configured as a separate processor operating independently of the processor ED20. When the image signal processor 1160 is configured as a processor separate from the processor ED20, the image processed by the image signal processor 1160 may be displayed on the display device ED60 after additional image processing has been performed by the processor ED20.

The electronic apparatus ED01 may include a plurality of camera modules ED80 each having a different property or function. In this case, one of the plurality of camera modules ED80 may be a wide-angle camera and another of the plurality of camera modules ED80 may be a telephoto camera. Similarly, one of the plurality of camera modules ED80 may be a front camera and another of the plurality of camera modules ED80 may be a rear camera.

According to embodiments, the image sensor 1000 may be applied to a mobile phone or a smartphone, a tablet or a smart tablet, a digital camera or a camcorder, a laptop computer, a television or a smart television, etc. For example, the smartphone or the smart tablet may include a plurality of high-resolution cameras each provided with a high-resolution image sensor. The high-resolution cameras may be used to extract depth information about subjects in an image, adjust out-focusing of an image, or automatically identify subjects in an image.

Also, the image sensor 1000 may be applied to a smart refrigerator, a security camera, a robot, a medical camera, etc. For example, the smart refrigerator may use an image sensor to automatically identify food in the smart refrigerator and inform a user of the presence of specific food, the type of stocked or withdrawn food, etc. through a smartphone. The security camera may provide an ultra-high-resolution image and may identify an object or a person in the image even in a dark environment by using high sensitivity. The robot may be deployed in a disaster or an industrial site that may not be directly accessed by a person and may provide a high-resolution image. The medical camera may provide a high-resolution image for diagnosis or surgery and may dynamically adjust the field of view.

Also, the image sensor 1000 may be applied to a vehicle. The vehicle may include a plurality of vehicle cameras arranged at various positions. According to an embodiment, each of the vehicle cameras may include the image sensor. The vehicle may provide a driver with various pieces of information about the inside or the surroundings of the vehicle by using the plurality of vehicle cameras and may provide information required for autonomous driving by automatically identifying an object or a person in an image.

While embodiments have been particularly shown and described, it will be understood that various changes in form and details may be made therein without departing from the spirit and scope of the following claims.

What is claimed is:

1. An image sensor comprising:
- a sensor substrate including a plurality of pixels configured to sense light;
- a color separation lens array including a plurality of pixel corresponding regions facing the plurality of pixels, wherein each pixel corresponding region of the plurality of pixel corresponding regions includes one or more nanoposts, and the one or more nanoposts are configured to form a phase profile that separates incident light for each wavelength, and to concentrate light in different wavelength bands on the plurality of pixels; and
- a filter array positioned between the sensor substrate and the color separation lens array, and including a plurality of transparent regions alternatingly arranged with a plurality of filters corresponding to a first color,
- wherein the plurality of pixels comprises a plurality of first pixels corresponding to the first color and a plurality of second pixels corresponding to a second color,
- wherein the plurality of filters corresponding to the first color are arranged to face the plurality of first pixels, and
- wherein the plurality of transparent regions are arranged to face the plurality of second pixels.

2. The image sensor of claim 1, wherein based on the first color and arrangement positions of the plurality of filters, the filter array is configured to block crosstalk of light in a longest wavelength band having a longest wavelength from among wavelengths corresponding to the different wavelength bands.

3. The image sensor of claim 1, wherein each pixel of the plurality of pixels includes a plurality of light sensing cells configured to perform an autofocus function.

4. The image sensor of claim 1, wherein the plurality of pixels includes a plurality of green pixels configured to sense green light, a plurality of blue pixels configured to sense blue light, and a plurality of red pixels configured to sense red light.

5. The image sensor of claim 4, wherein the plurality of filters includes red filters configured to block red light from being incident on the plurality of green pixels and the plurality of blue pixels.

6. The image sensor of claim 4, wherein the plurality of green pixels, the plurality of blue pixels, and the plurality of red pixels are arranged according to a Bayer pattern.

7. The image sensor of claim 6, wherein the plurality of filters includes green filters arranged to face the plurality of green pixels.

8. The image sensor of claim 6, wherein the plurality of filters includes cyan filters arranged to face the plurality of green pixels and the plurality of blue pixels.

9. The image sensor of claim 4, wherein the plurality of filters includes blue filters arranged to face the plurality of blue pixels.

10. The image sensor of claim 4, wherein the plurality of filters includes cyan filters arranged to face the plurality of green pixels and the plurality of blue pixels.

11. The image sensor of claim 1, wherein the plurality of pixels includes a cyan pixel, a magenta pixel, a yellow pixel, and a green pixel.

12. The image sensor of claim 11, wherein the plurality of filters include cyan filters arranged to face the cyan pixel and the green pixel.

13. The image sensor of claim 4, wherein the plurality of green pixels, the plurality of blue pixels, and the plurality of red pixels are arranged according to a Bayer pattern using pixel binning.

14. The image sensor of claim 13, wherein the plurality of pixels includes:
- a first pixel group and a second pixel group that are arranged in a first direction; and
- a third pixel group and a fourth pixel group that are arranged in a second direction parallel to the first direction,
- wherein each of the first pixel group and the second pixel group includes at least one red pixel alternatingly arranged with at least one first green pixel,
- wherein each of the third pixel group and the fourth pixel group includes at least second one green pixel alternatingly arranged with at least one blue pixel, and
- wherein combined pixels included in the first pixel group, the second pixel group, the third pixel group, and the fourth pixel group are combined into a color arrangement corresponding to the Bayer pattern.

15. The image sensor of claim 14, wherein the image sensor is configured to operate in a first mode in which the combined pixels are arranged in a diagonal, or a second mode in which the combined pixels are arranged in a diamond pattern.

16. The image sensor of claim 15, wherein a number of the combined pixels corresponding to the first mode is different from a number of the combined pixels corresponding to the second mode.

17. The image sensor of claim 1, further comprising a spacer layer positioned between the filter array and the color separation lens array.

18. The image sensor of claim 17, wherein a thickness of the spacer layer is less than a focal length of light having a central wavelength from among wavelengths corresponding to the different wavelength bands.

19. An electronic apparatus comprising:
- an image sensor configured to convert an optical image into an electrical signal, the image sensor comprising:
  - a sensor substrate including a plurality of pixels configured to sense light,
  - a color separation lens array including a plurality of pixel corresponding regions facing the plurality of pixels, wherein each pixel corresponding region of the plurality of pixel corresponding regions includes one or more nanoposts, and the one or more nanoposts are configured to form a phase profile that separates incident light for each wavelength, and to concentrate light in different wavelength bands on the plurality of pixels, and a filter array positioned between the sensor substrate and the color separation lens array, and including a plurality of transparent regions alternately arranged with a plurality of filters corresponding to a first color; and a processor configured to control an operation of the image sensor and to store and output a signal generated by the image sensor, wherein the plurality of pixels comprises a plurality of first pixels corresponding to the first color and a plurality of second pixels corresponding to a second color, wherein the plurality of filters corresponding to the first color are arranged to face the plurality of first pixels, and wherein the plurality of transparent regions are arranged to face the plurality of second pixels.

20. An image sensor comprising:

a sensor substrate including a plurality of pixels;

a lens array including one or more nanoposts configured modify a phase profile of light incident on the lens array in order to concentrate light having a particular wavelength onto a pixel of the plurality of pixels; and a filter array positioned between the sensor substrate and the lens array, and including a plurality of transparent regions and a plurality of filters corresponding to a first color, wherein the plurality of pixels comprises a plurality of first pixels corresponding to the first color and a plurality of second pixels corresponding to a second color, wherein the plurality of filters corresponding to the first color are arranged to face the plurality of first pixels, and wherein the plurality of transparent regions are arranged to face the plurality of second pixels.

* * * * *